United States Patent [19]
Kaida et al.

[11] Patent Number: 5,644,273
[45] Date of Patent: Jul. 1, 1997

[54] PIEZOELECTRIC RESONATOR DEVICE OF TUNING FORK TYPE

[75] Inventors: Hiroaki Kaida; Jiro Inoue; Masatoshi Kajiwara; Hiroshi Nakatani; Katsumi Fujimoto; Katsumi Sakai, all of Nagaokakyo, Japan

[73] Assignee: Murata Manufacturing Co., Ltd., Japan

[21] Appl. No.: 476,051

[22] Filed: Jun. 7, 1995

Related U.S. Application Data

[63] Continuation of Ser. No. 279,704, Jul. 25, 1994, abandoned, which is a continuation of Ser. No. 60,615, May 12, 1993, abandoned, which is a division of Ser. No. 919,100, Jul. 23, 1992, Pat. No. 5,373,267, which is a division of Ser. No. 431,539, Nov. 3, 1989, Pat. No. 5,159,301.

[30] Foreign Application Priority Data

| Jun. 14, 1989 | [JP] | Japan | 1-69438 |
| Jun. 14, 1989 | [JP] | Japan | 1-69439 |
| Aug. 7, 1989 | [JP] | Japan | 1-92702 |
| Aug. 7, 1989 | [JP] | Japan | 1-92703 |

[51] Int. Cl.$^6$ ...................................................... H03H 9/21
[52] U.S. Cl. .......................... 333/187; 333/200; 310/370
[58] Field of Search ............................ 333/187–192, 333/200; 310/367, 370

[56] References Cited

U.S. PATENT DOCUMENTS 5,159,301  10/1992  Kaida et al. .................. 333/200 X

FOREIGN PATENT DOCUMENTS

| 53122 | 3/1982 | Japan | 333/200 |
| 53121 | 3/1982 | Japan | 333/200 |
| 146416 | 6/1989 | Japan | 333/187 |

*Primary Examiner*—Benny Lee
*Attorney, Agent, or Firm*—Ostrolenk, Faber, Gerb & Soffen, LLP

[57] ABSTRACT

Disclosed is a piezoelectric resonator device. This piezoelectric resonator device comprises a piezoelectric substrate having an almost rectangular plane shape. The piezoelectric substrate is provided with a slit extending to the inside from one edge of the piezoelectric substrate, for forming a tuning fork portion, and a pair of slits for separating the tuning fork portion, spaced apart from the slit forming the tuning fork portion by a predetermined distance on both sides of the slit forming the tuning fork portion, and approximately parallel with the slit forming the tuning fork portion. Vibrating electrodes are formed on both major surfaces of the piezoelectric substrate at a piezoelectric vibrating portion, between the slits separating the tuning fork portion from non-vibrating portions of the substrate.

3 Claims, 22 Drawing Sheets

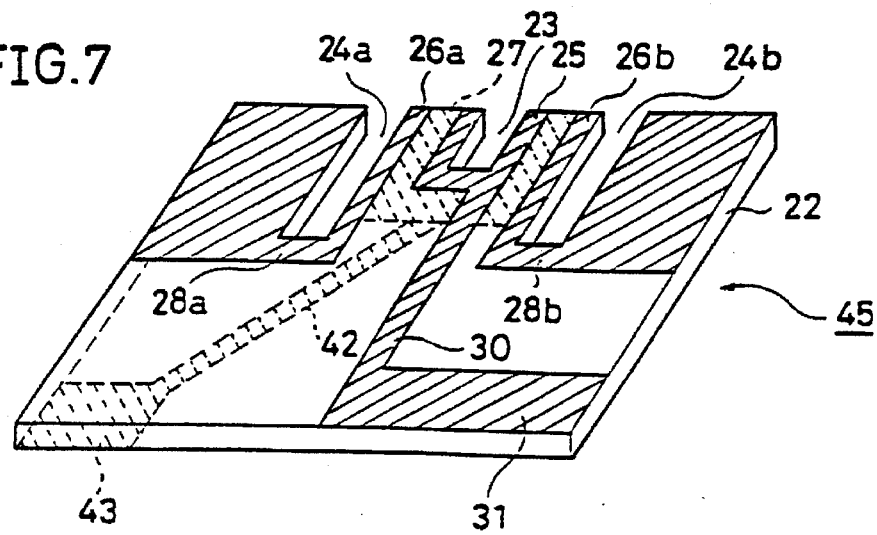
FIG. 7
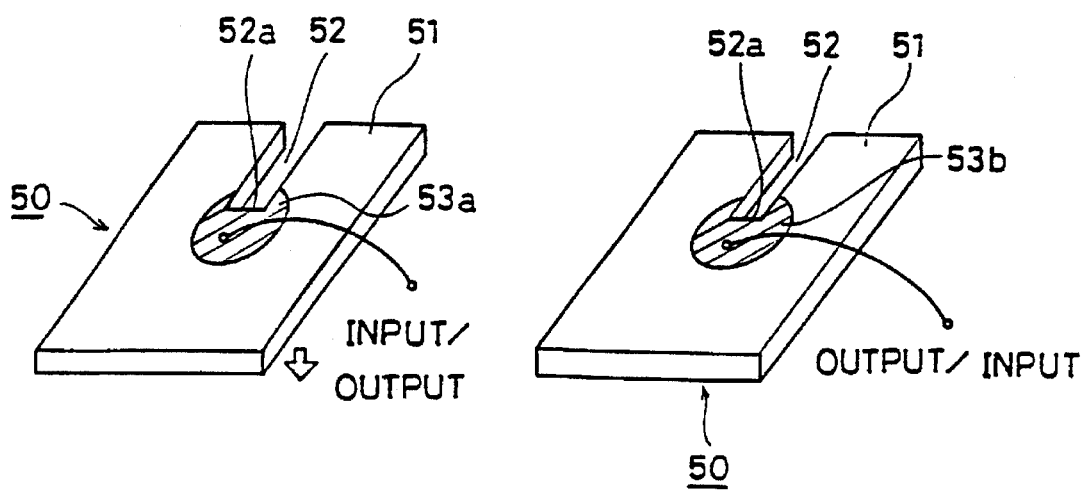
FIG. 8A
FIG. 8B
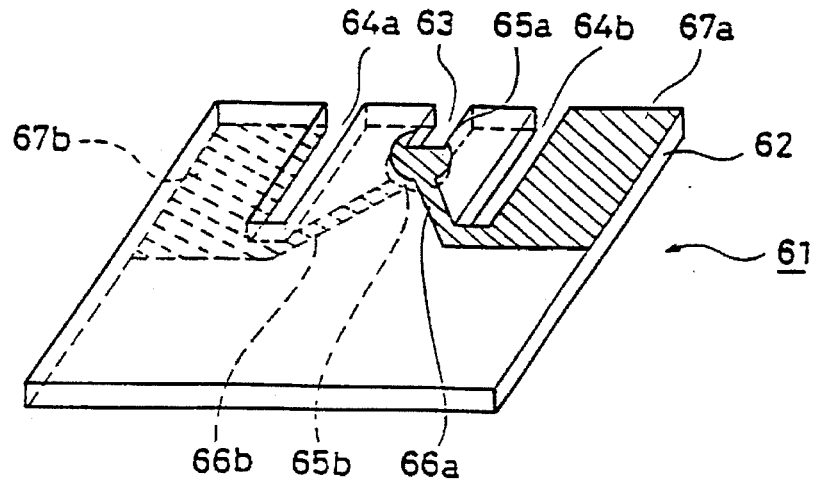
FIG. 9

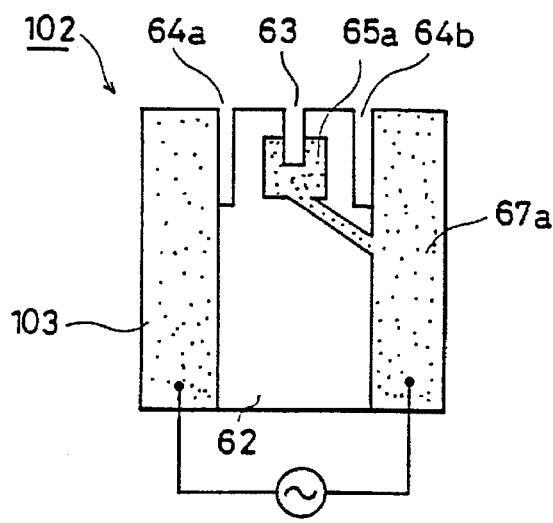
FIG.13A
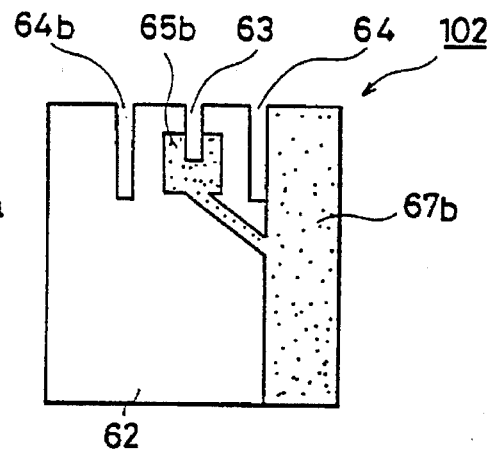
FIG.13B
FIG.14
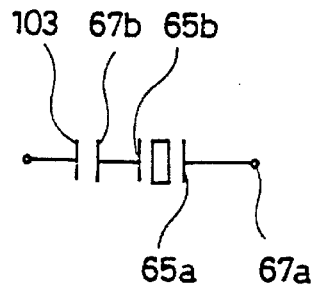
FIG.15
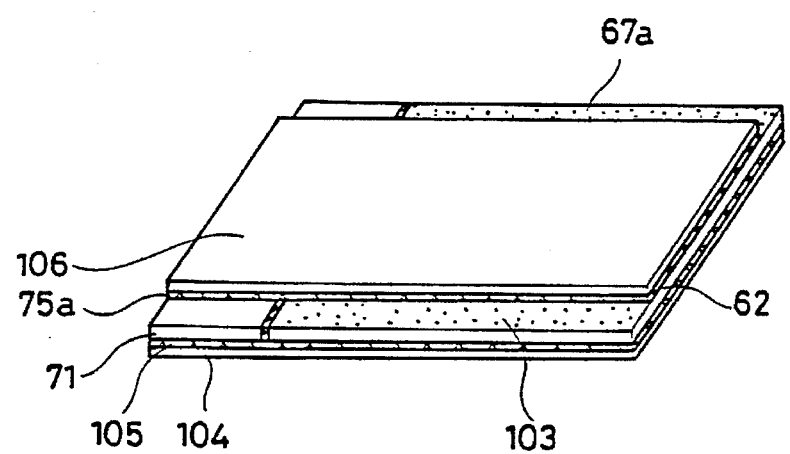

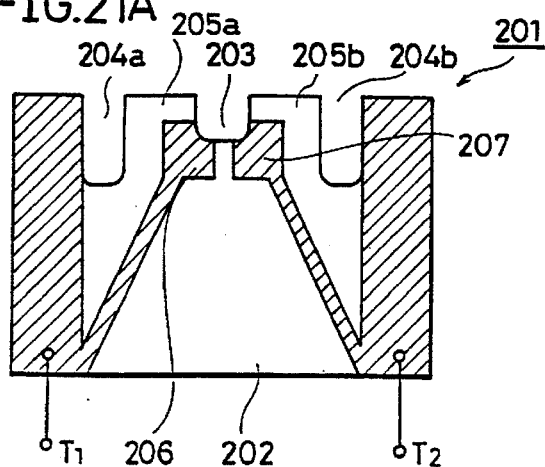
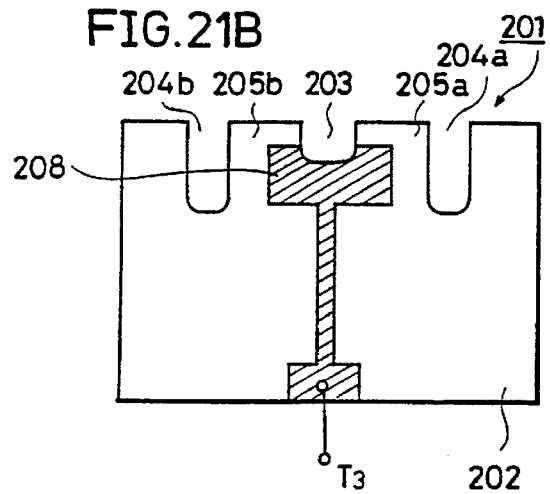
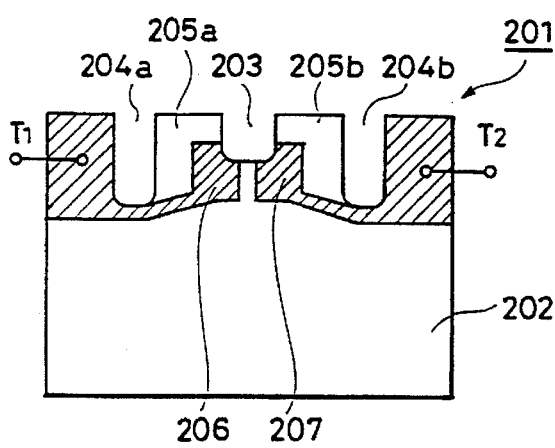
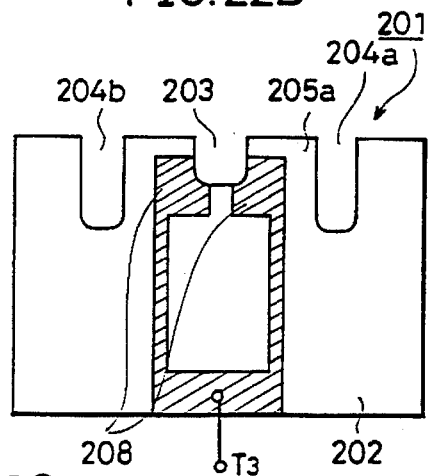
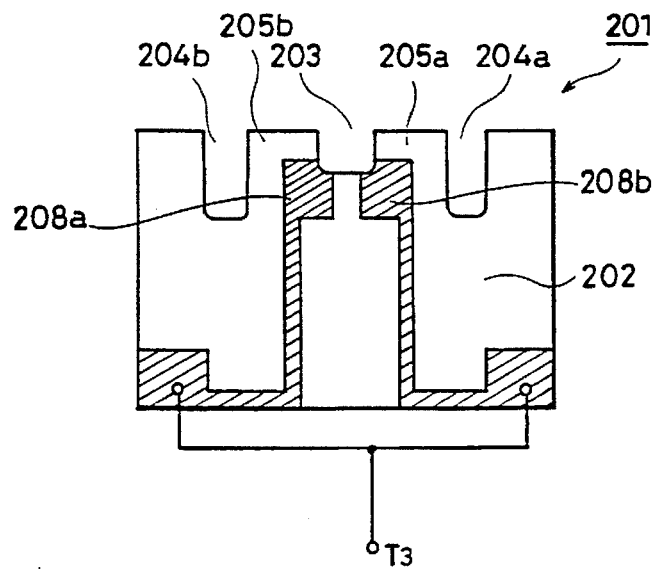

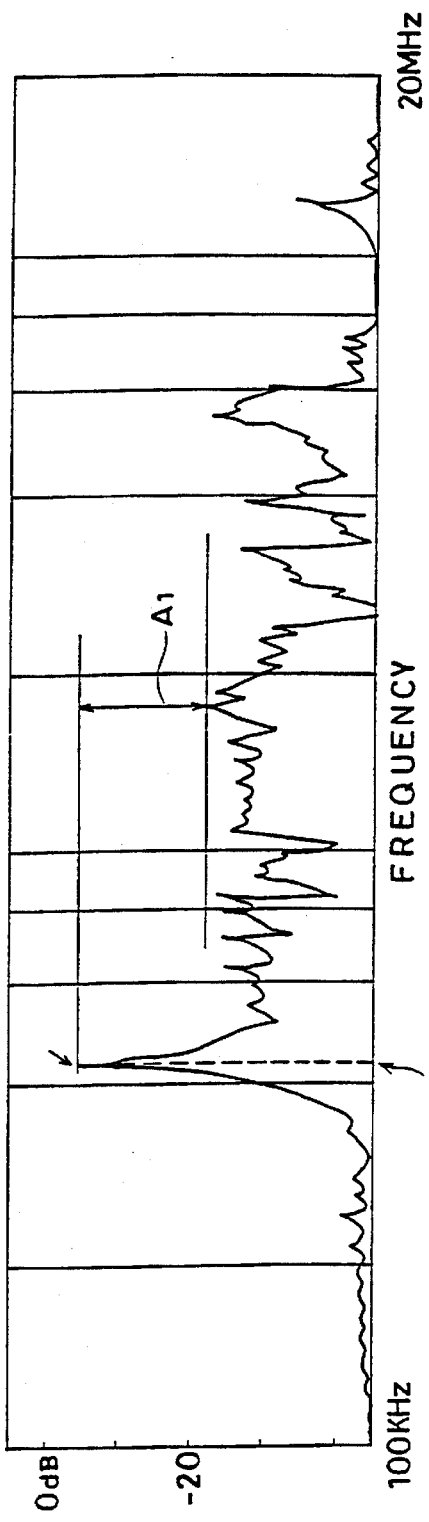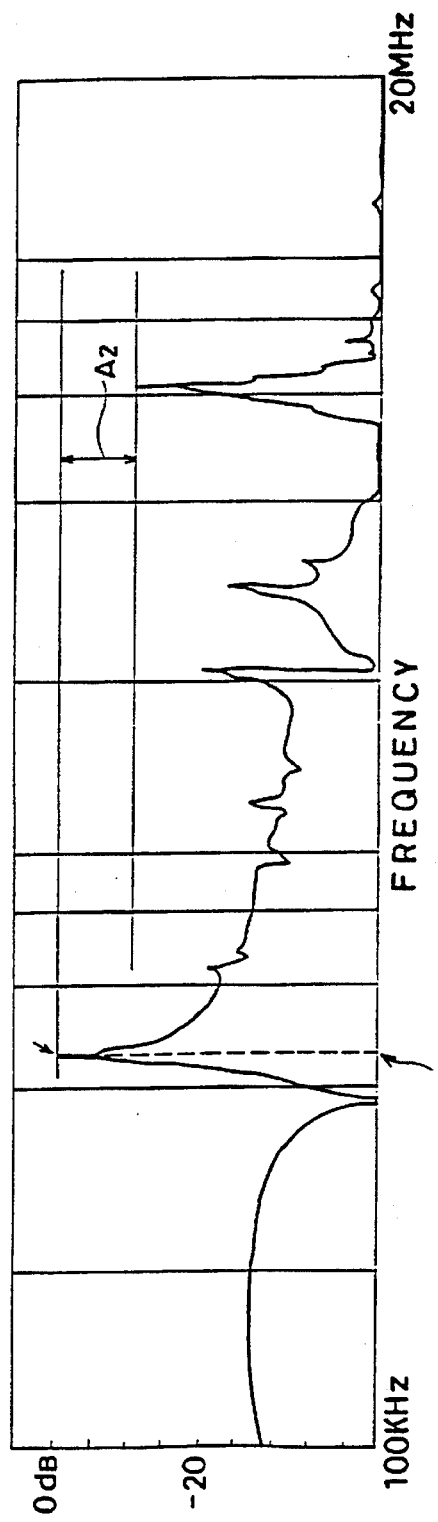

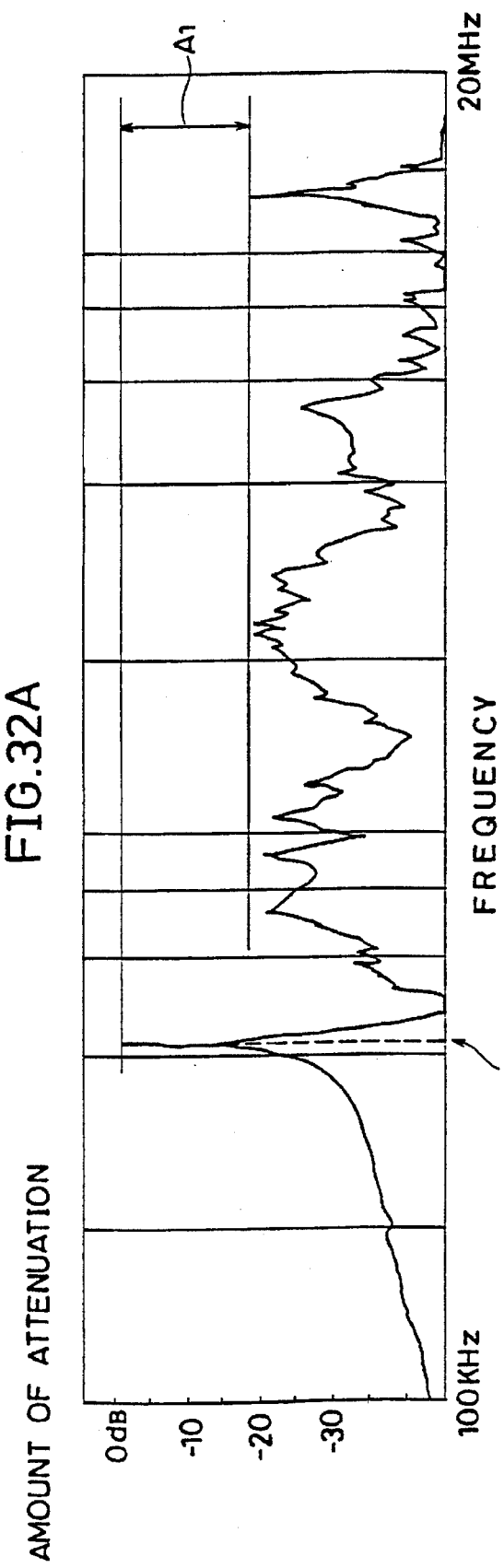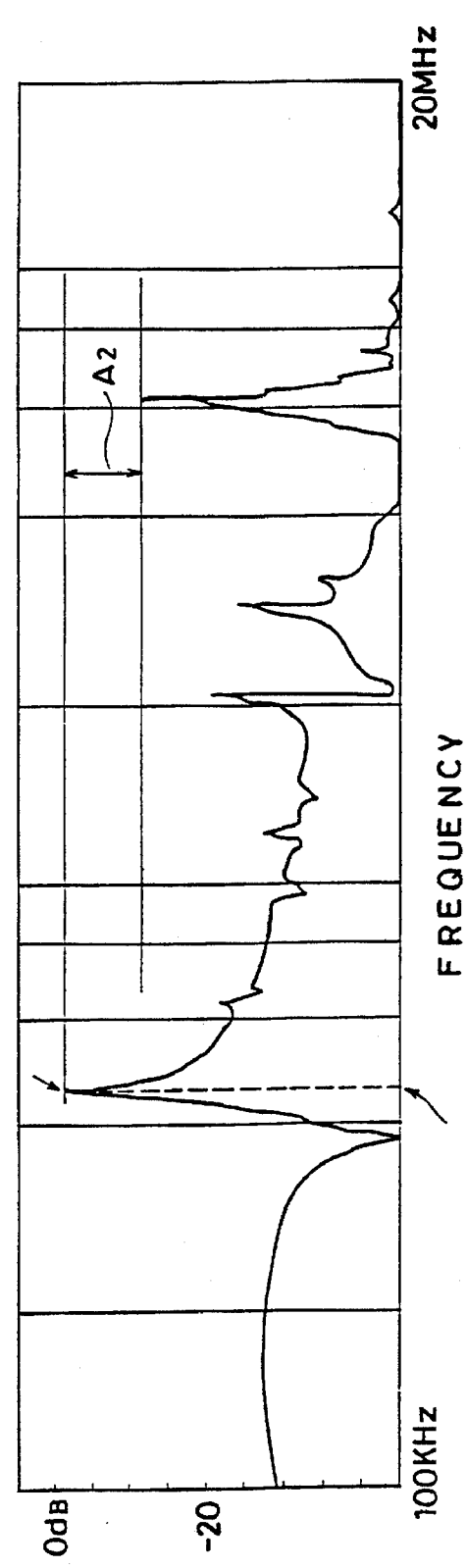

PIEZOELECTRIC RESONATOR DEVICE OF TUNING FORK TYPE

This is a continuation of application Ser. No. 08/279,704 filed on Jul. 25, 1994, now abandoned, which is a continuation of application Ser. No. 08/060,615 filed on May 12, 1993, abandoned, which is a division of application Ser. No. 07/919,100, filed Jul. 23, 1992, now U.S. Pat. No. 5,373,267, which is a division of application Ser. No. 07/431,539, filed Nov. 3, 1989, now U.S. Pat. No. 5,159,301, issued Oct. 27, 1992.

BACKGROUND OF THE INVENTION

1. Field of the Invention

The present invention relates generally to piezoelectric resonator devices referred to as tuning fork type piezoelectric resonator devices, and more particularly, to a piezoelectric resonator device having a structure in which a tuning fork type vibrating portion is formed by providing a piezoelectric substrate with slits.

2. Description of the Prior Art

FIGS. 1A and 1B show an example of a conventional tuning fork type piezoelectric vibrator. In the tuning fork type piezoelectric vibrator 1, a piezoelectric substrate 2 almost rectangular in shape is provided with a slit 3. On the upper surface of the piezoelectric substrate 2, an electrode 4a is provided in the vicinity of the slit 3 and an electrode 4b is provided spaced apart from the electrode 4a by a predetermined distance around the periphery of the piezoelectric substrate 2. On the other hand, as shown in FIG. 1B, on the lower surface of the piezoelectric substrate 2, a common electrode 5 is formed so as to be opposed to the electrodes 4a and 4b through the piezoelectric substrate 2.

The electrodes 4a and 4b formed on the upper surface of the piezoelectric substrate 2 are respectively used as input and output terminals, or vice versa, thereby causing portions on both sides of the slit 3 provided in the piezoelectric substrate 2 to be vibrated so as to widen or narrow the slit 3.

FIGS. 2A and 2B illustrate a tuning fork type piezoelectric vibrator having a structure for facilitating electrical connection to the exterior added to the above described tuning fork type piezoelectric vibrator 1. In this tuning fork type piezoelectric vibrator 6, a piezoelectric substrate 7 is provided with a slit 8. As shown in FIG. 2A, on the upper surface of the piezoelectric substrate 7, an electrode 9a formed around the slit 8 is electrically connected to a connecting electrode 10a formed in a non-vibrating region. In addition, a pair of electrodes 9b are formed spaced apart from the electrode 9a by a predetermined distance and are electrically connected to connecting electrodes 10b formed in the non-vibrating region, respectively. Lead terminals 11a, 11b, to 11c are respectively joined to the connecting electrodes 10a and 10b. On the other major surface of the piezoelectric substrate 7, a common electrode 12 is formed.

In use, the lead terminals 11a and 11c are electrically connected to each other outside of the tuning fork type piezoelectric vibrator 6.

In the tuning fork type piezoelectric vibrator 6 as shown in FIGS. 2A and 2B, the oscillation frequency thereof is adjusted depending on dimensions such as the length of the slit 8 and the width of a piezoelectric substrate portion where the electrodes 9a and 9b are formed. Utilizing the vibration of a tuning fork has the advantage that a small-sized resonator having a wide frequency range of tens to several hundreds of kilohertz can be constructed by adjusting the above described length of the slit and the basic width of the substrate. In order to make the most of this advantage, the connecting electrode portions must be arranged in as small an area as possible.

However, when the lead terminals 11a to 11c are joined by soldering, there is a limit to how much the size of the soldering portions can be reduced. Accordingly, the sizes of the connecting electrodes 10a and 10b can not be so reduced.

Consequently, it has also been considered to change the plane shape of the piezoelectric substrate 7 so as to enlarge the portion where the connecting electrodes 10a and 70b are formed, while making small only the vibrating portions on both sides of the slit 8. If the plane shape of the piezoelectric substrate 7 is thus changed, however, it becomes difficult to cut the piezoelectric substrate 7 from a mother substrate. In addition, a useless portion occurs in cutting down the piezoelectric substrate 7 from the mother substrate. Accordingly, modified tuning fork type piezoelectric vibrator 6 has the disadvantage of being increased in cost.

SUMMARY OF THE INVENTION

Accordingly, an object of the present invention is to provide a piezoelectric resonator device comprising a small-sized tuning fork type resonator part without using a piezoelectric substrate having a complicated plane shape.

In accordance with a broad aspect, the present invention provides a piezoelectric resonator device in which a tuning fork type vibrating portion is formed by providing a piezoelectric substrate with slits, which comprises a piezoelectric substrate having an almost rectangular plane shape, the piezoelectric substrate comprising a slit for forming a "tuning fork portion (referred to as tuning fork portion forming slit" hereinafter) extending to the inside from one edge of the piezoelectric substrate and provided for forming a tuning fork portion; and a pair of slits for separating a "tuning fork portion (referred to as tuning fork portion separating slits" hereinafter) formed spaced apart from the tuning fork portion forming slit by a predetermined distance on both sides of the tuning fork portion forming slit, and approximately parallel with the tuning fork portion forming slit, and which further comprises vibrating electrodes formed on both major surfaces of the piezoelectric substrate in the vicinity of the above described tuning fork portion forming slit.

In accordance with an aspect of the present invention, the above described vibrating electrodes are adapted to comprise a first electrode formed along both side edges of the tuning fork portion forming slit on one major surface of the piezoelectric substrate, second electrodes formed spaced apart from the first electrode with spacing along respective side edges, on the side of the first electrode, of the tuning fork portion separating slits, and a third electrode formed so as to be opposed to both the first and second electrodes on the other major surface of the above described piezoelectric substrate.

Furthermore, in accordance with another aspect of the present invention, the above described vibrating electrodes comprise a first electrode formed so as to surround a tuning fork portion forming slit in the vicinity of an innermost portion of the tuning fork portion forming slit, on one major surface of a piezoelectric substrate, and a second electrode formed so as to be opposed to the first electrode on both sides of the piezoelectric substrate on the other major surface of the piezoelectric substrate.

According to the present invention, the piezoelectric tuning fork portion is constituted by a portion where the tuning fork portion forming slit and the vibrating electrodes are provided, and the piezoelectric tuning fork portion is substantially separated from the other portion of the piezoelectric substrate, that is, a non-vibrating region, by the pair of tuning fork portion separating slits. Accordingly, the piezoelectric tuning fork portion can be vibrated alone, in an almost freely vibrating state. Consequently, the piezoelectric tuning fork portion alone can be made small and the vibrating electrode portion can be made large in the non-vibrating region. Furthermore, the piezoelectric tuning fork portion is supported by the piezoelectric substrate portion outside of the tuning fork portion separating slits, so that various sizes of the piezoelectric tuning fork portion itself can be freely produced. Therefore, a resonator whose resonance frequency has a wide frequency range can be achieved without changing the plane shape of the entire piezoelectric substrate.

According to the present invention, the above described vibrating electrodes are changed in a variety of manners as described in detail in the following embodiments, thereby allowing various piezoelectric resonator devices such as a piezoelectric resonator, a piezoelectric resonator having capacitance added thereto and a piezoelectric filter to be constructed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1A is a perspective view as seen from the side of the upper surface and FIG. 1B is a perspective view as seen from the side of the lower surface;

FIG. 2A is a perspective view as seen from the side of the upper surface and FIG. 2B is a perspective view as seen from the side of the lower surface;

FIG. 3A is a perspective view as seen from the side of the upper surface and FIG. 3B is a perspective view as seen from the side of the lower surface;

FIG. 7 is a perspective view illustrating a tuning fork type piezoelectric resonator according to a third embodiment of the present invention;

FIGS. 8A and 8B are perspective views for explaining an example of a tuning fork type piezoelectric vibrator, where FIG. 8A is a perspective view as seen from the side of the upper surface and FIG. 8B is a perspective view as seen from the side of the lower surface;

FIG. 9 is a perspective view illustrating a tuning fork type resonator according to a fourth embodiment of the present invention;

FIGS. 13A and 13B are respectively a plan view and a bottom plan view showing main portions of the piezoelectric resonator according to the fifth embodiment;

FIG. 14 is a diagram showing a circuit structure of the piezoelectric resonator according the fifth embodiment;

FIG. 15 is a perspective view showing a modified example of the piezoelectric resonator according to the fifth embodiment;

FIGS. 21A and 21B are respectively a plan view and a bottom plan view illustrating a piezoelectric filter according to a ninth embodiment of the present invention;

FIG. 22A is a plan view showing a modified example of an electrode pattern on the side of the upper surface of the piezoelectric filter according to the ninth embodiment, and FIGS. 22B and 22C are plan views respectively showing modified examples of an electrode pattern on the side of the lower surface of the piezoelectric filter according to the ninth embodiment;

FIG. 28A is a diagram showing attenuation-frequency characteristics of the piezoelectric filter according to the embodiments of the present invention, and FIG. 28B is a diagram showing attenuation-frequency characteristics of the piezoelectric filter of the prior art;

FIG. 32A is a diagram showing attenuation-frequency characteristics of the piezoelectric filter according to the twelfth embodiment of the present invention, and FIG. 32B is a diagram showing attenuation-frequency characteristics of the piezoelectric filter of the prior art;

DESCRIPTION OF THE PREFERRED EMBODIMENTS

Figure 1A:
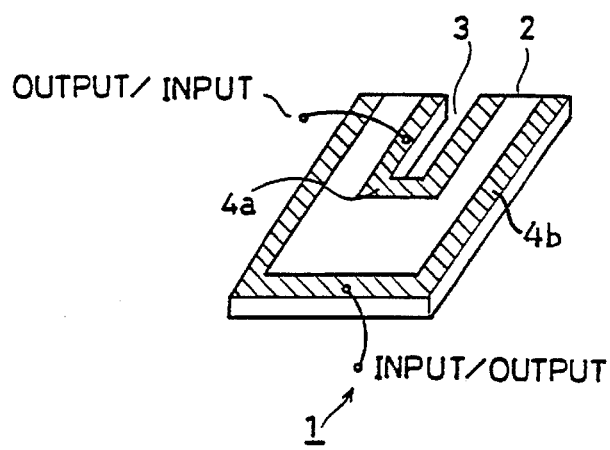
FIGS. 1A and 1B are perspective views showing an example of a conventional tuning fork type piezoelectric resonator, where
Figure 1B:
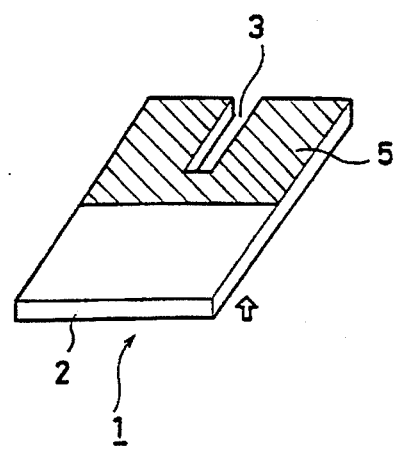
Figure 2A:
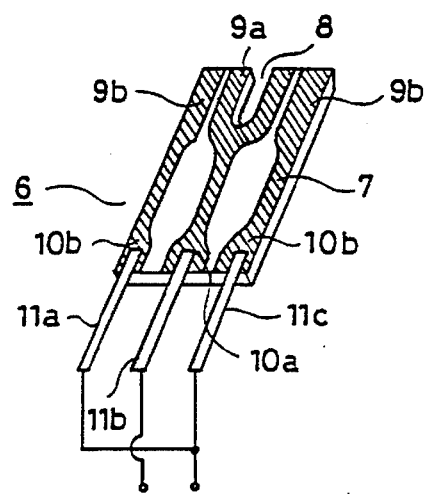
FIGS. 2A and 2B are perspective views for explaining another example of a conventional tuning fork type piezoelectric resonator, where
Figure 2B:
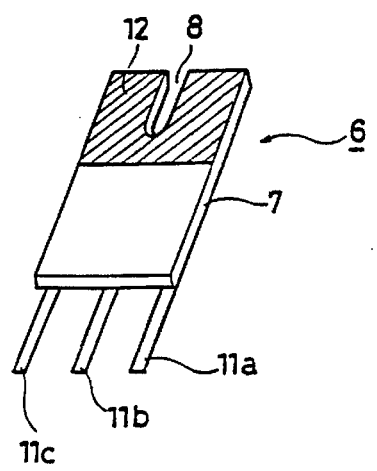
Figure 3A:
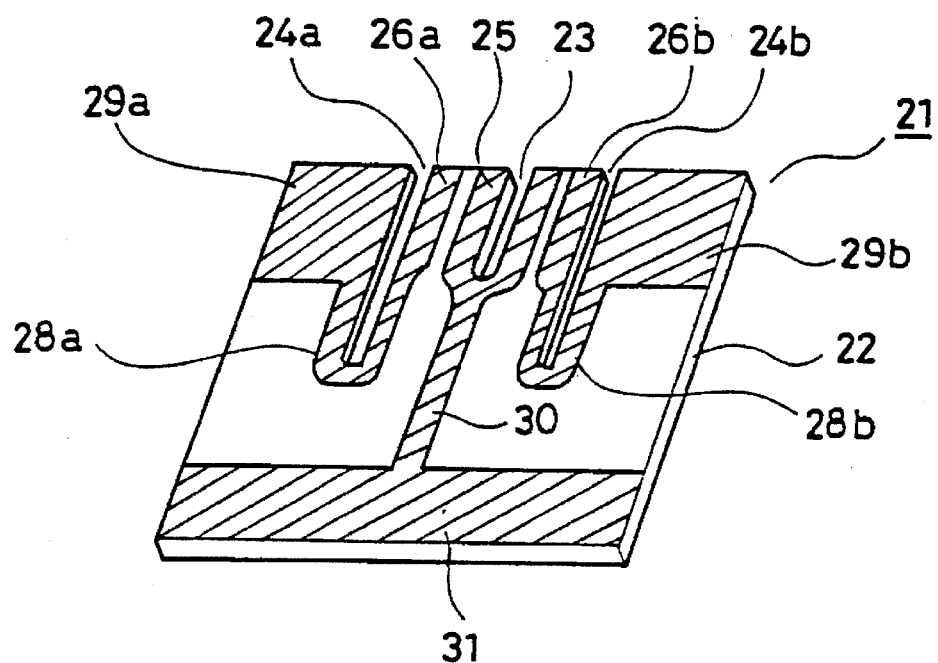
FIGS. 3A and 3B are perspective views illustrating a tuning fork type piezoelectric resonator according to a first embodiment of the present invention, where
Figure 3B:
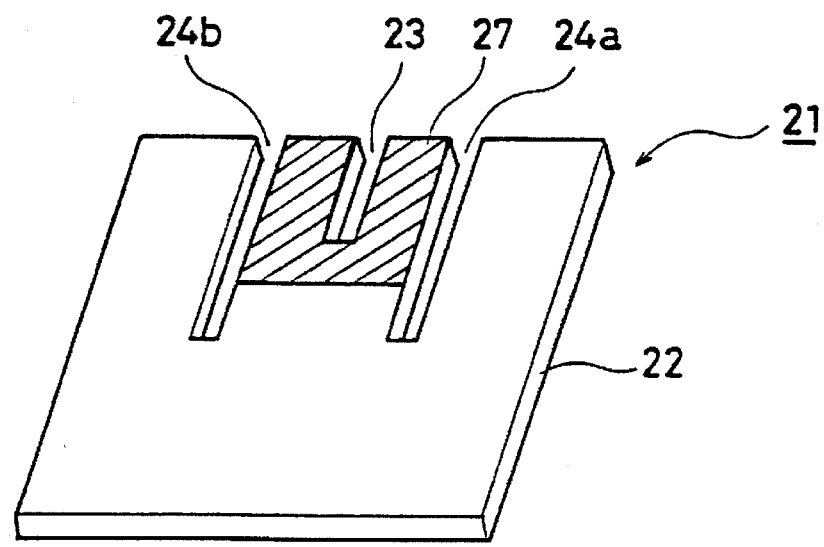

FIGS. 3A and 3B are perspective views illustrating a piezoelectric resonator according to a first embodiment of the present invention as respectively seen from the side of the upper surface and the side of the lower surface.

A piezoelectric resonator 21 is constructed by using a piezoelectric substrate 22 rectangular in plane shape which is subjected to polarization processing in the thickness direction. A slit 23 for forming a tuning fork portion is formed so as to extend to the inside from one edge of the piezoelectric substrate 22. In addition, slits 24a and 24b for separating a tuning fork portion are formed spaced apart from the tuning fork portion forming slit 23 by a predetermined distance and parallel with the tuning fork portion forming slit 23. In the present embodiment, vibrating electrodes as described below are formed between the tuning fork portion separating slits 24a and 24b, thereby to constitute a tuning fork type vibrating portion. In order to more reliably separate the tuning fork type vibrating portion from the other portions of the piezoelectric substrate 22, the tuning fork portion separating slits 24a and 24b are made longer than the tuning fork portion forming slit 23.

On the upper surface of the piezoelectric substrate 22, a U-shaped first electrode 25 along the periphery of the tuning fork portion forming slit 23 is formed in the vicinity of the tuning fork portion forming slit 23. In addition, second electrodes 26a and 26b are formed spaced apart from the first electrode 25 with predetermined spacing along respective edges, on the side of the first electrode 25, of the tuning fork portion separating slits 24a and 24b. As shown in FIG. 3B, on the lower surface of the piezoelectric substrate 22, a third electrode 27 is formed so as to be opposed to the first electrode 25 and the second electrodes 26a and 26b through the piezoelectric substrate 22.

Furthermore, electrodes 29a and 29b electrically connected to the second electrodes 26a and 26b through connecting conductive portions 28a and 28b are respectively formed in regions outside of the tuning fork portion separating slits 24a and 24b.

On the other hand, an electrode 31 electrically connected to the first electrode 25 through a connecting conductive portion 30 is formed in a non-vibrating region of the piezoelectric substrate 22.

The above described piezoelectric substrate 22 itself is formed to have a certain degree of size. However, the piezoelectric tuning fork portion interposed between the tuning fork portion separating slits 24a and 24b which is an vibrating portion can be made smaller or larger by suitably selecting the positions where the tuning fork portion forming slit 23 and the tuning fork portion separating slits 24a and 24b are formed and the widths thereof. Accordingly, only the piezoelectric tuning fork portion can be made smaller by selecting the sizes of the above described slits 23, 24a and 24b. Consequently, a resonator whose resonance frequency has a wide frequency range can be simply achieved without complicating the plane shape of the entire piezoelectric substrate 22.

Figure 4:
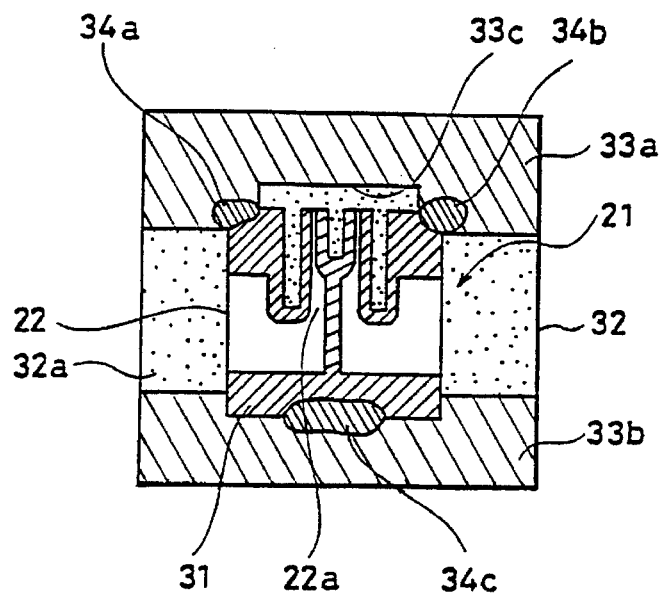
FIG. 4 is a plan view showing a state where the piezoelectric resonator according to the first embodiment is joined to a supporting substrate.

FIG. 4 is a plan view showing a state where a piezoelectric resonator 21 is held in a holding substrate 32. The holding substrate 32 is formed of a rectangular plate-like member slightly larger than the piezoelectric substrate 22. On the upper surface of the holding substrate 32A, a pair of connecting electrodes 33a and 33b is formed spaced apart from each other by a predetermined distance and approximately parallel with each other. The connecting electrode 33a is provided with a concave portion 33c such that the piezoelectric tuning fork portion does not come into contact with the connecting electrode 33a when the piezoelectric substrate 22 is superimposed on the holding substrate 32.

Meanwhile, the above described connecting electrodes 33a and 33b are adapted to have a certain degree of thickness. Accordingly, the connecting electrodes 33a and 33b are formed to be projected above an upper surface 32a of the holding substrate 32. Accordingly, when the piezoelectric substrate 22 is deposited on the holding substrate 32 as shown in FIG. 4, the lower surface of the piezoelectric substrate 22 enters a state floated from the upper surface 32a of the holding substrate 32. In particular, the tuning fork portion is only connected to the other portions of the piezoelectric substrate 22 by a leg portion 22a and the other portions are in a completely floating state.

Consequently, the piezoelectric substrate 22 is fixed to the holding substrate 32 by joining the electrodes 29a and 29b (see FIG. 3A) to the connecting electrode 33a by solders 34a and 34b and joining an electrode 31 to the connecting electrode 33b by a solder 34c. The tuning fork type piezoelectric vibrating portion between the tuning fork portion separating slits 24a and 24b is vibrated by applying a signal for excitation to the connecting electrodes 33a and 33b.

Figure 5:
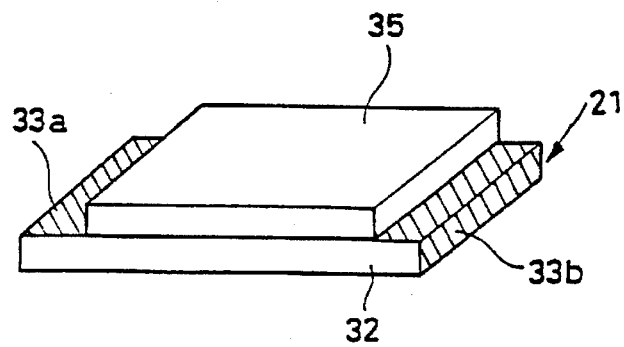
FIG. 5 is a perspective view showing a state where a protective substrate is affixed to the piezoelectric resonator according to the first embodiment.

In order to increase environment resistance in the actual use, a cover 35 made of, for example, synthetic resin for covering the piezoelectric substrate 22 (not shown in FIG. 5) may be adhered to the upper surface of the holding substrate 32. In the structure shown in FIG. 5, the piezoelectric resonator 21 can be mounted on a printed circuit board or the like using the connecting electrodes 33a and 33b exposed to the exterior of the cover 35.

Although in the above described first embodiment, the electrodes 29a and 29b for connection to the exterior are arranged in corner portions of the piezoelectric substrate 22 and the electrode 31 is formed in a corner portion on the opposite side of the electrodes 29a and 29b, the electrodes 29a and 29b and the electrode 31 can be provided in arbitrary positions in a non-vibrating region other than the tuning fork type piezoelectric vibrating portion so far as they are not overlapped with each other.

Additionally, the above described electrodes for connection to the exterior may be formed on the lower surface of the piezoelectric substrate 22, though a suitable connecting conductive portion must be formed so as to electrically connect the electrodes for connection to the first and second electrodes on the upper surface of the piezoelectric substrate 22.

Figure 6:
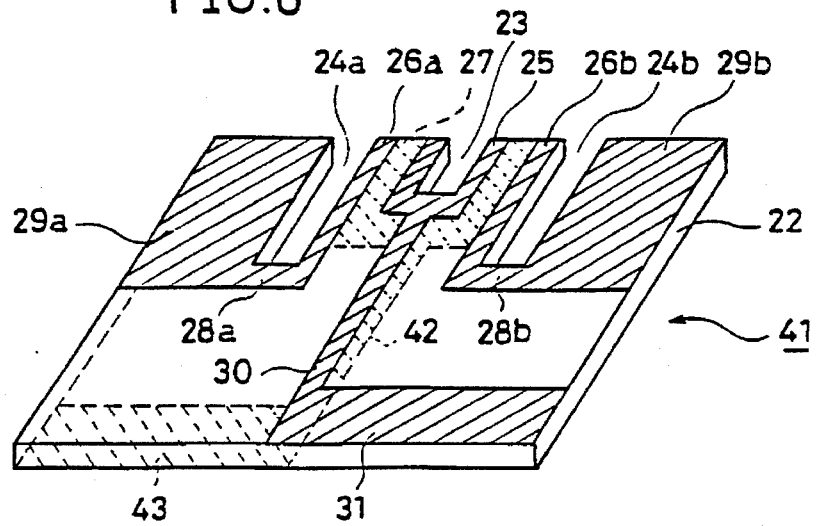
FIG. 6 is a perspective view illustrating a piezoelectric resonator according to a second embodiment of the present invention.

FIG. 6 illustrates a piezoelectric resonator 41 according to a second embodiment of the present invention. The present embodiment is a modified example of the piezoelectric resonator 21 shown in FIGS. 3A and 3B. Accordingly, corresponding reference numerals are assigned to portions corresponding to those of the piezoelectric resonator 21 and hence, the description of the piezoelectric resonator 21 is incorporated.

The piezoelectric resonator 41 is the same as the piezoelectric resonator 21 except that an electrode 31 is formed in only one corner of a piezoelectric substrate 22, and a common electrode 27 formed on the lower surface of the piezoelectric substrate 22 is electrically connected to a connecting electrode 43 by a connecting conductive portion 42. The connecting electrode 43 is formed in a corner different from the corner in which the electrode 31 is formed on the upper surface of the piezoelectric substrate 22. The piezoelectric resonator 41 according to the present embodiment can be used as a three-terminal type piezoelectric resonator by connecting electrodes 29a and 29b and an electrode 30 to an input-output electrode and connecting the connecting electrode 43 to an earth potential.

FIG. 7 is a perspective view illustrating a piezoelectric resonator according to a third embodiment of the present invention. This piezoelectric resonator 45 is a three-terminal type piezoelectric resonator having almost the same structure as that of the piezoelectric resonator 41 shown in FIG. 6. The piezoelectric resonator 45 is the same as the piezoelectric resonator 41 except that a connecting conductive portion 42 for connecting a connecting electrode 43 to a third electrode 27 is formed so as not to be overlapped with a connecting conductive portion 30 on the upper surface of a piezoelectric substrate 22. More specifically, in the piezoelectric resonator 45 shown in FIG. 7, all the connecting conductive portions formed on the upper surface and the lower surface of the piezoelectric substrate 22 are formed in the positions where they are not overlapped with each other through the piezoelectric substrate 22. In the piezoelectric resonator 41 shown in FIG. 6, the connecting conductive portion 30 and the connecting conductive portion 42 are overlapped with each other. Accordingly, parallel capacitance included in a tuning fork type piezoelectric vibrator is increased, so that frequency characteristics are liable to be degraded. On the other hand, in the piezoelectric resonator 45 shown in FIG. 7, all connecting conductive portions 28a, 28b, 30 and 42 are arranged so as not to be overlapped with each other through the piezoelectric substrate 22. Accordingly, parallel capacitance included in a tuning fork type piezoelectric vibrator is decreased, so that frequency characteristics are improved.

FIGS. 8A and 8B are perspective views for explaining another example of vibrating electrodes constituting a piezoelectric tuning fork 50 as respectively seen from the side of the upper surface and the side of the lower surface. A rectangular piezoelectric substrate 51 polarized in the direction represented by an arrow is provided with a tuning fork portion forming slit 52. First and second electrodes 53a and 53b are formed on both major surfaces of the piezoelectric substrate 51 so as to surround the tuning fork portion forming slit 52 in the vicinity of an innermost portion 52a of the tuning fork portion forming slit 52. In a piezoelectric resonator 50, the tuning fork portion forming slit 52 is widened or narrowed to cause vibration by applying a signal for excitation between the first and second electrodes 53a and 53b formed on both the major surfaces.

Referring to FIG. 9, description is made of a fourth embodiment of the present invention utilizing the principle of the above described piezoelectric resonator 50. In a piezoelectric resonator 61 according to the embodiment shown in FIG. 9, a piezoelectric substrate 62 almost rectangular in plane shape is provided with a tuning fork portion forming slit 63. In addition, there is provided a pair of tuning fork portion separating slits 64a and 64b spaced apart from the tuning fork portion forming slit 63 by a predetermined distance and approximately parallel with the tuning fork portion forming slit 63. The tuning fork portion separating slits 64a and 64b are made longer than the tuning fork portion forming slit 63.

In the present embodiment (FIG. 9), first and second electrodes 65a and 65b are formed on both major surfaces of the piezoelectric substrate 62 so as to surround the tuning fork portion forming slit 63 in the vicinity of an innermost portion of the tuning fork portion forming slit 63. The first electrode 65a is connected to a connecting electrode 67a formed in a non-vibrating region outside of the tuning fork portion separating slit 64b by a connecting conductive portion 66a. Similarly, the second electrode 65b is electrically connected to a connecting electrode 67b formed in a non-vibrating region through a connecting conductive portion 66b on the lower surface of a piezoelectric substrate 62.

In the piezoelectric resonator 61 shown in FIG. 9, an electrode structure formed in the piezoelectric substrate 62 can be significantly simplified, as seen by comparison with the piezoelectric resonator 21 shown in FIGS. 3A and 3B. Accordingly, a tuning fork type piezoelectric resonator of smaller size can be achieved due to the simpler electrode structure. Also, in the piezoelectric resonator 61, the connecting conductive portions 66a and 66b are not overlapped with each other through the piezoelectric substrate 62. Consequently, parallel capacitance included in the piezoelectric resonator 61 can be reduced as in the case of the piezoelectric resonator 45 shown in FIG. 7.

Figure 10A:
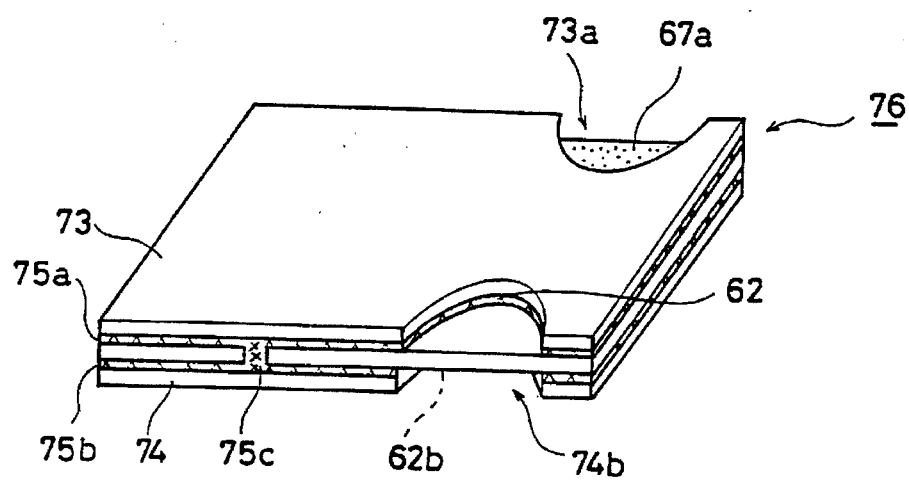
FIGS. 10A and 10B are respectively a perspective view and an exploded perspective view for explaining an example in which the piezoelectric resonator according to the third embodiment is constructed as a chip type piezoelectric resonator part.
Figure 10B:
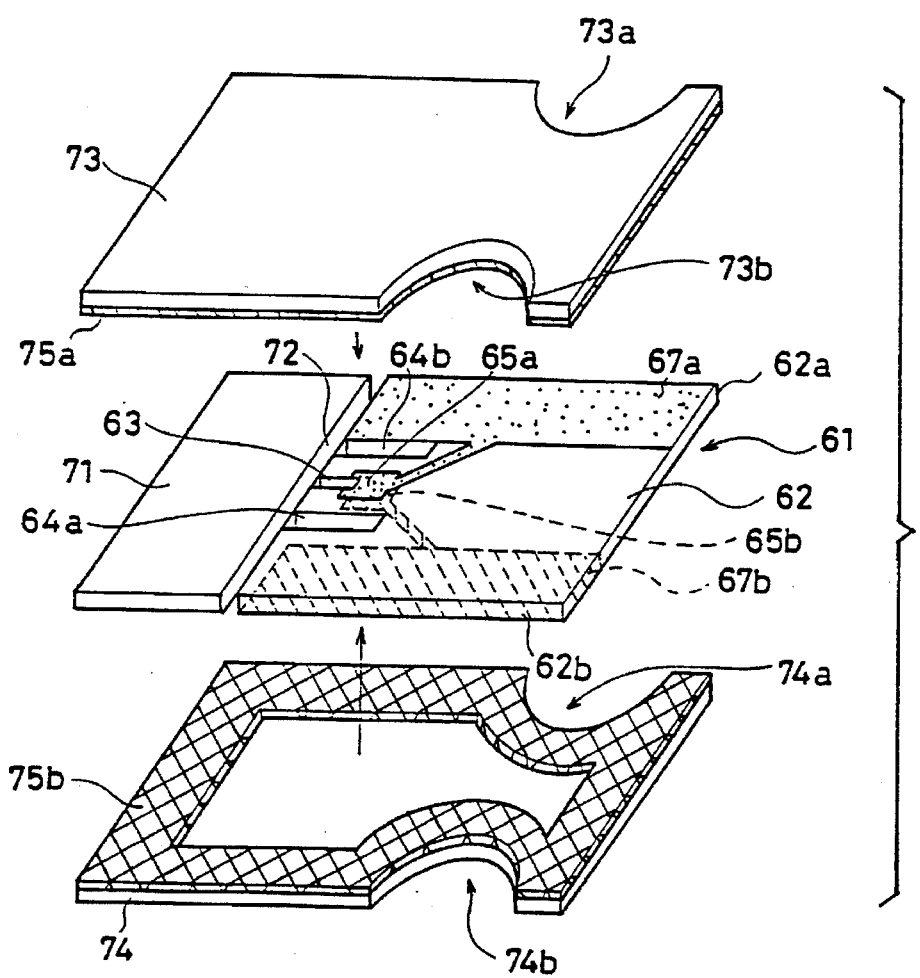

FIGS. 10A and 10B are perspective views for explaining an example in which the piezoelectric resonator 61 according to the fourth embodiment is constructed as a chip type piezoelectric resonator part.

As shown in FIG. 10B, a spacer 71 is arranged in a side part of a piezoelectric resonator 61. This spacer 71 is formed of a plate-like member having almost the same thickness as that of a piezoelectric substrate 62 and is arranged spaced apart from a tuning fork type vibrating portion of the piezoelectric substrate 62 through a cavity 72. In the present embodiment, first and second electrodes 65a and 65b are made rectangular in shape and connecting electrodes 67a and 67b are respectively formed over the total lengths of side edges 62a and 62b of the piezoelectric substrate 62, unlike the piezoelectric resonator 61 shown in FIG. 9.

Protective sheets 73 and 74 are respectively affixed to the upper and lower surfaces of the above described piezoelectric resonator 61 and spacer 71 with adhesives 75a and 75b. The protective sheets 73 and 74 are respectively provided with a pair of notches 73a and 73b and a pair of notches 74a and 74b.

The notches 73a and 73b and 74a and 74b are respectively provided so as to expose the connecting electrodes 67a and 67b to the exterior. Members shown in FIG. 10B are affixed with the above described adhesives 75a and 75b, thereby to obtain a chip type piezoelectric resonator part 76 shown in FIG. 10A.

Meanwhile, the adhesives 75a and 75b are formed so as not to lead to a tuning fork type vibrating portion, as shown in FIG. 10B. Consequently, the vibration of the tuning fork type vibrating portion is not prevented by the adhesives 75a and 75b.

Furthermore, as indicated by reference numeral 75c in FIG. 10A, the adhesives 75a and 75b flow into both end portions of the cavity 72, thereby causing airtightness of the tuning fork type vibrating portion to be held.

The size of the entire external form of the piezoelectric resonator part 76 shown in FIG. 10A becomes larger than the size of the piezoelectric substrate 62 by the size of the spacer 71. However, the piezoelectric resonator part 76 can be made smaller in size, as compared with a structure using a case for containing the piezoelectric substrate 82. In addition, it can be manufactured by affixing plate-like members to each other. Consequently, the piezoelectric resonator part 76 can be manufactured by simple processes and is superior in quantity production.

Additionally, the cavity 72 is provided in the vicinity of the tuning fork type vibrating portion but the periphery thereof is fixed with the adhesives 75a and 75b. Consequently, the vibration of the vibrating portion is satisfactorily trapped, so that characteristics of the piezoelectric resonator part 76 is improved.

Meanwhile, the adhesives 15a and 15b may not be previously applied on the side of the protective sheets 73 and 74 but the side of the piezoelectric resonator 61 and the spacer 71.

Figure 11A:
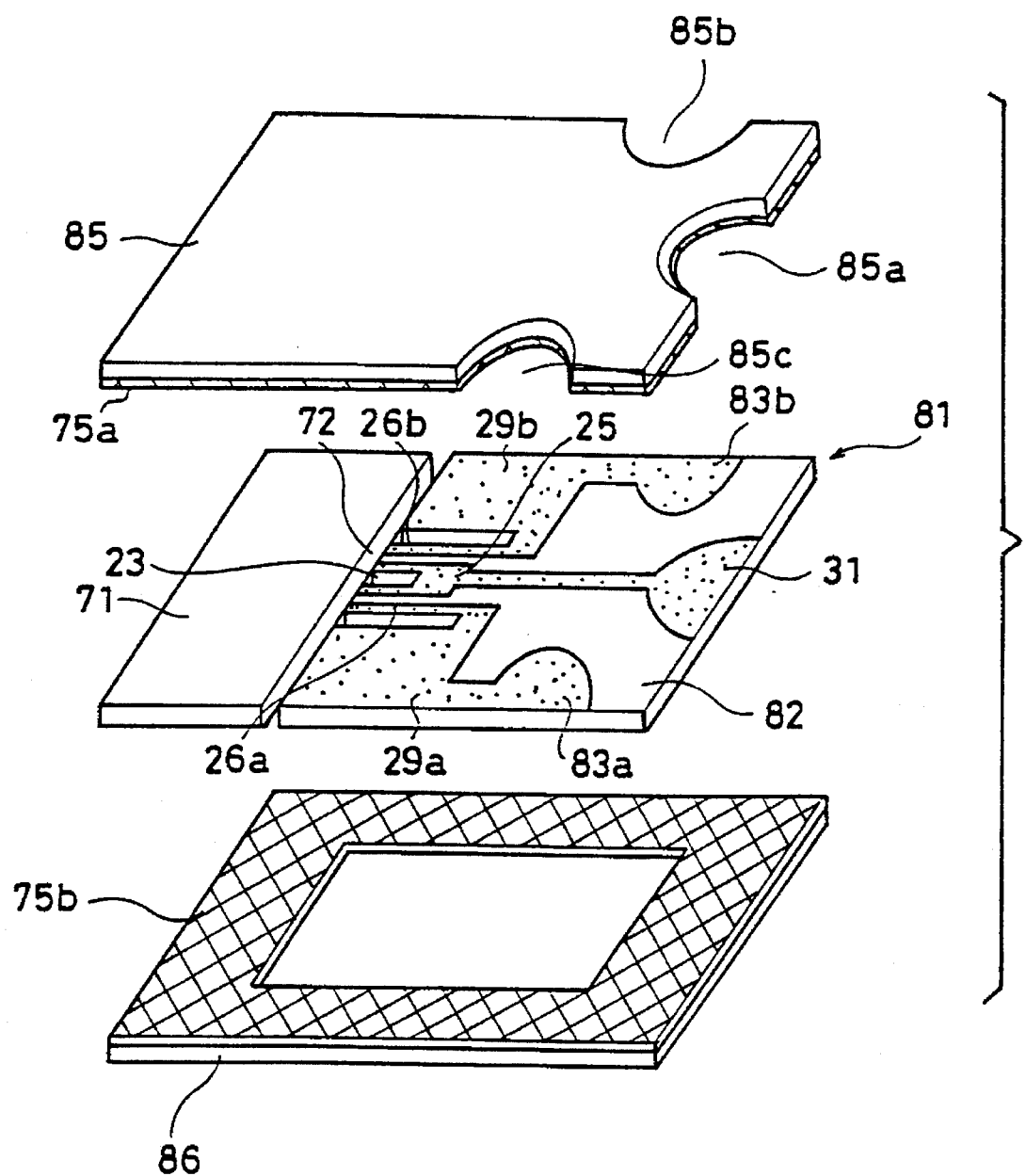
FIGS. 11A and 11B are exploded perspective views for explaining an example in which the piezoelectric resonator according to the fourth embodiment is constructed as a chip type piezoelectric resonator part.

FIG. 11A is an exploded perspective view showing another example in which a piezoelectric resonator is constructed as a chip type piezoelectric resonator part. In this example, a piezoelectric resonator 81 having the same structure as that of the piezoelectric resonator 21 shown in FIGS. 3A and 3B is used, though electrodes 29a and 29b are electrically connected to a connecting electrodes 83a and 83b of a nearly half-round shape and a connecting electrode 31 is also produced in a half-round shape in the vicinity of a central portion of one side of a piezoelectric substrate 82. Protective sheets 85 and 86 having a shape different from that of the protective sheets shown in FIG. 10B are used. More specifically, the protective sheet 85 is provided with notches 85a, 85b, 85c for exposing the connecting electrode 31 and the connecting electrodes 83a and 83b, while the protective sheet 88 is provided with no notches.

Figure 11B:
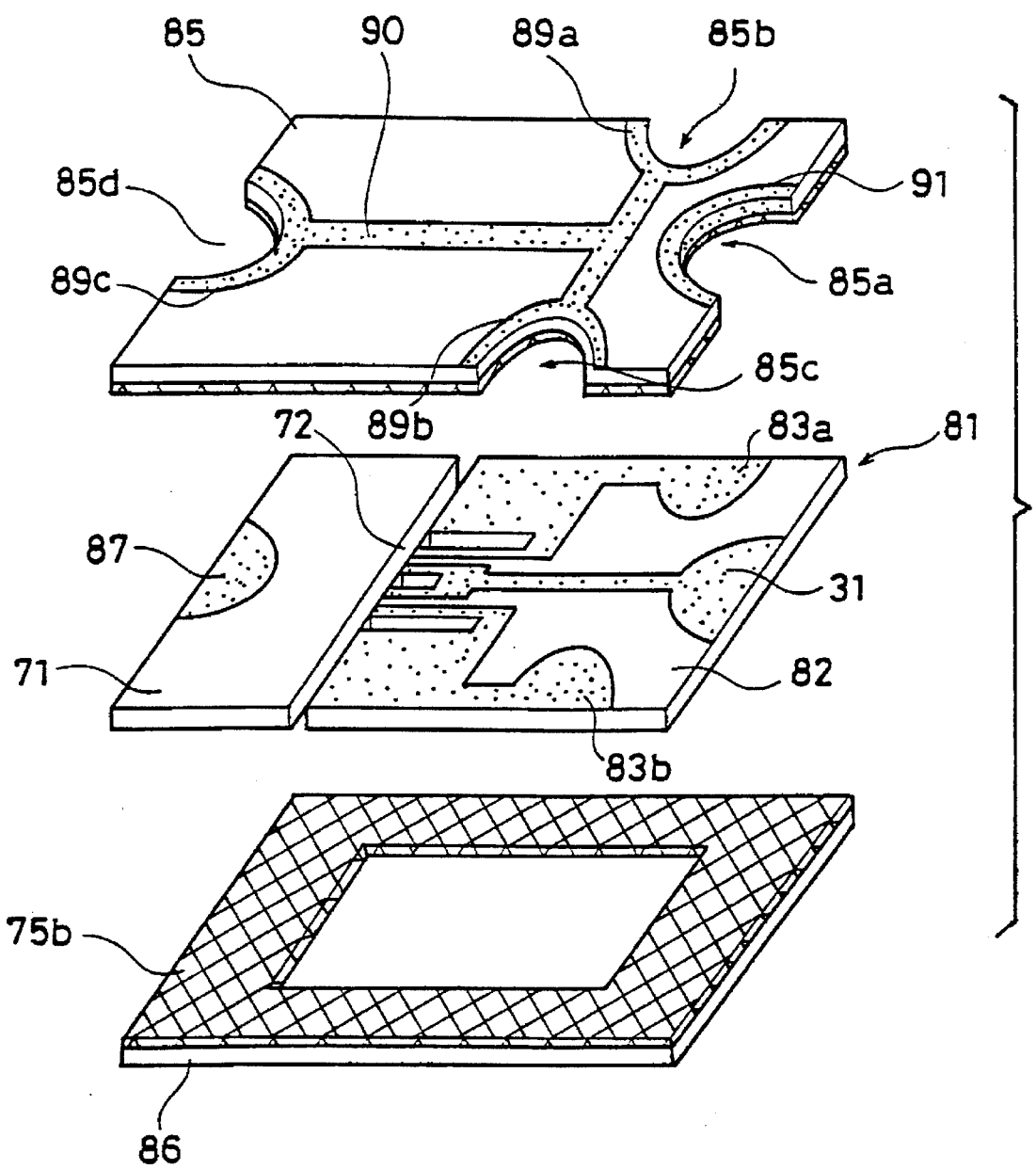

FIG. 11B is an exploded perspective view for explaining still another example of the chip type piezoelectric resonator part. In this example, a connecting electrode 87 of a half-round shape is formed on the upper surface of a spacer 71. An upper protective sheet 85 is provided with notches 85a and 85d. The notch 85d is provided so as to expose the connecting electrode 87 when the protective sheet 85 is superimposed on the spacer 71.

Furthermore, connecting conductive portions 89a, 89b and 89c along the notches 85b, 85c and 85d are formed on the upper surface of the protective sheet 85. The connecting conductive portions 89a and 89c are electrically connected to each other by a connecting conductive portion 90. On the other hand, a connecting conductive portion 91 is formed around the periphery of the notch 85a. In the structure shown in FIG. 11B, connecting electrodes 83a and 83b, a connecting electrode 31 and the connecting electrode 87 are exposed in the notches 85a and 85d when the protective sheet 85 is adhered to the upper surfaces of a piezoelectric resonator 81 and the spacer 71. As a result, the connecting electrodes 83a and 83b and the connecting electrode 87 are electrically connected to each other by the connecting conductive portion 90. Accordingly, the electrical connection to the exterior can be made by only soldering the connecting electrode 87 and the connecting electrode 31 to the exterior in mounting the chip type piezoelectric resonator part to a printed circuit board or the like.

Figure 12A:
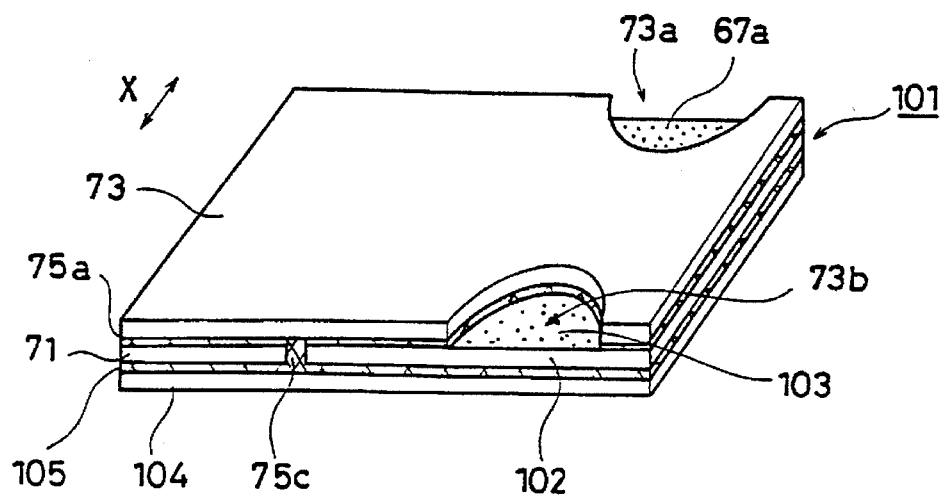
FIGS. 12A and 12B are respectively a perspective view and an exploded perspective view for explaining a chip type piezoelectric resonator according to a fifth embodiment of the present invention.

Referring to FIGS. 12A and 14, description is made of a chip type piezoelectric resonator part according to a fifth embodiment of the present invention.

A chip type piezoelectric resonator part 101 shown in FIGS. 12A and 12B has a structure similar to that of the chip type piezoelectric resonator part 78 shown in FIGS. 10A and 10B and hence, only portions different from those of the piezoelectric resonator part 76 will be described. Reference numeral 75c indicates an adhesive layer. In a piezoelectric resonator 102, a connecting electrode 103 is formed on the upper surface of a piezoelectric substrate 62 so as to be opposed to a connecting electrode 67b on the lower surface thereof through the piezoelectric substrate 62. Consequently, this connecting electrode 103 is electrically connected to the connecting electrode 67b on the lower surface of the piezoelectric substrate 62 through capacitance of the piezoelectric substrate 62. An electrode structure of the piezoelectric resonator 102 can be easily understood by referring to FIGS. 13A and 13B.

In the piezoelectric resonator 102, therefore, a structure shown in FIG. 14 is obtained in which a piezoelectric resonator unit and a capacitor are connected in series between a connecting electrode 103 and a connecting electrode 67a.

Figure 12B:
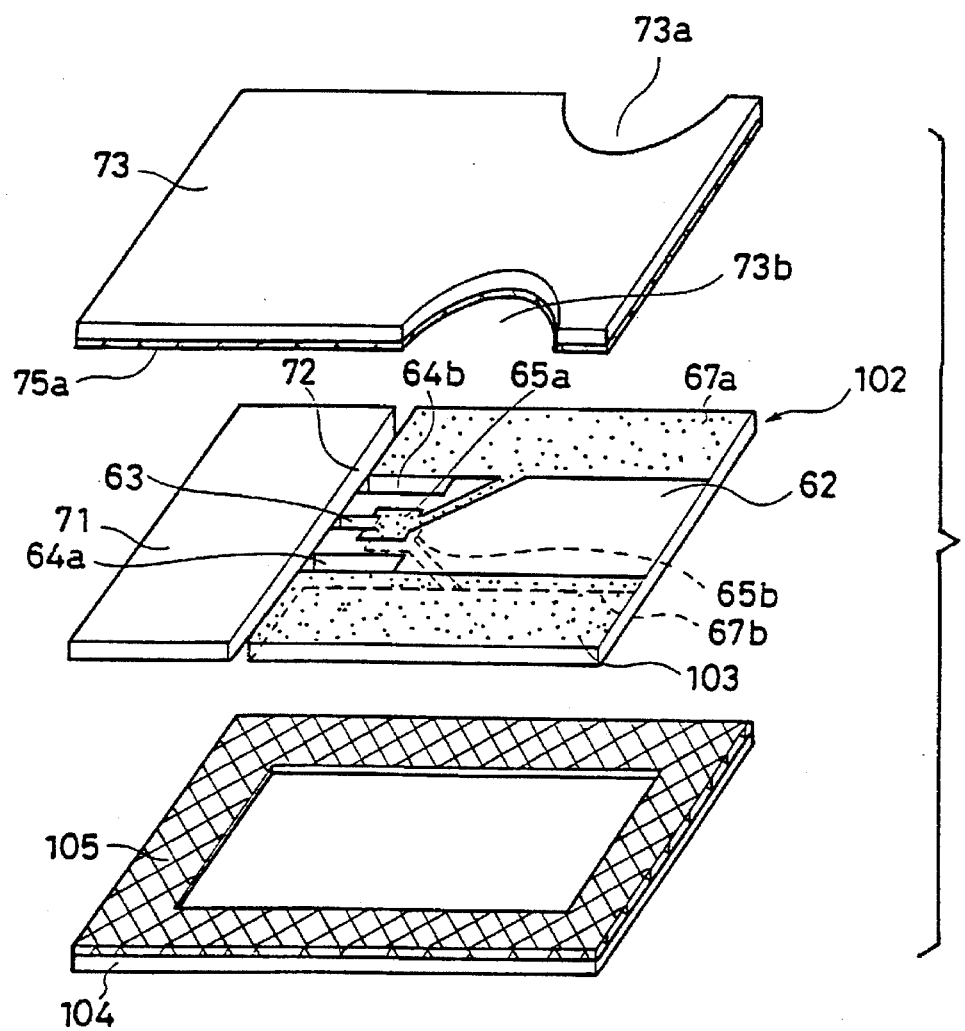

Turning to FIG. 12B, a lower protective sheet 104 is provided with no notches. More specifically, the rectangular protective sheet 104 is affixed to the lower surfaces of the piezoelectric resonator 102 and the spacer 71 with an adhesive 105. On the other hand, an upper protective sheet 73 is constructed similarly to the protective sheet 73 shown in FIG. 10B.

In the chip type piezoelectric resonator part 101 according to the present embodiment (FIG. 12A), both the connecting electrodes 103 and 67a for connection to the exterior are exposed on the upper surface of the part 101. Accordingly, the chip type piezoelectric resonator part 101 can be significantly simply mounted on a printed circuit board or the like.

As shown in FIG. 15, a protective sheet 106 having a small width may be used to expose the connecting electrodes 103 and 67a.

Figure 16A:
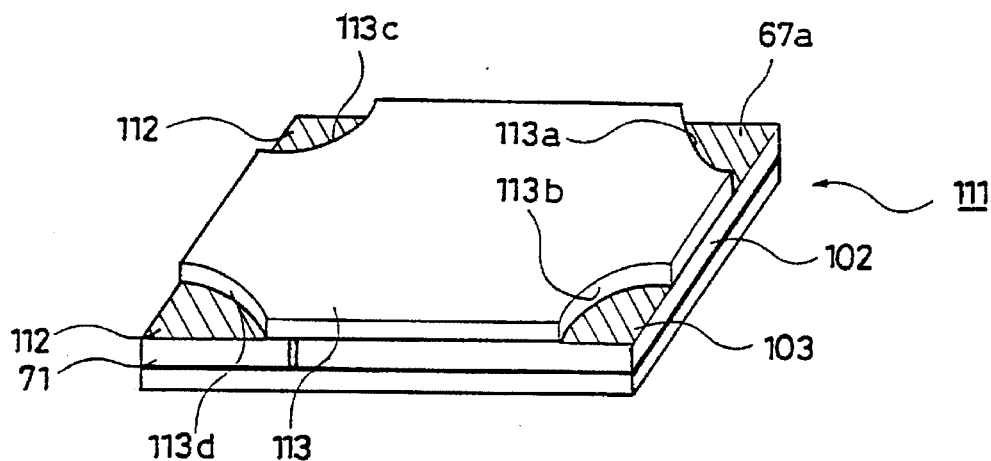
FIGS. 16A and 16B are respectively a perspective view and an exploded perspective view illustrating a piezoelectric resonator part according to a sixth embodiment of the present invention.
Figure 16B:
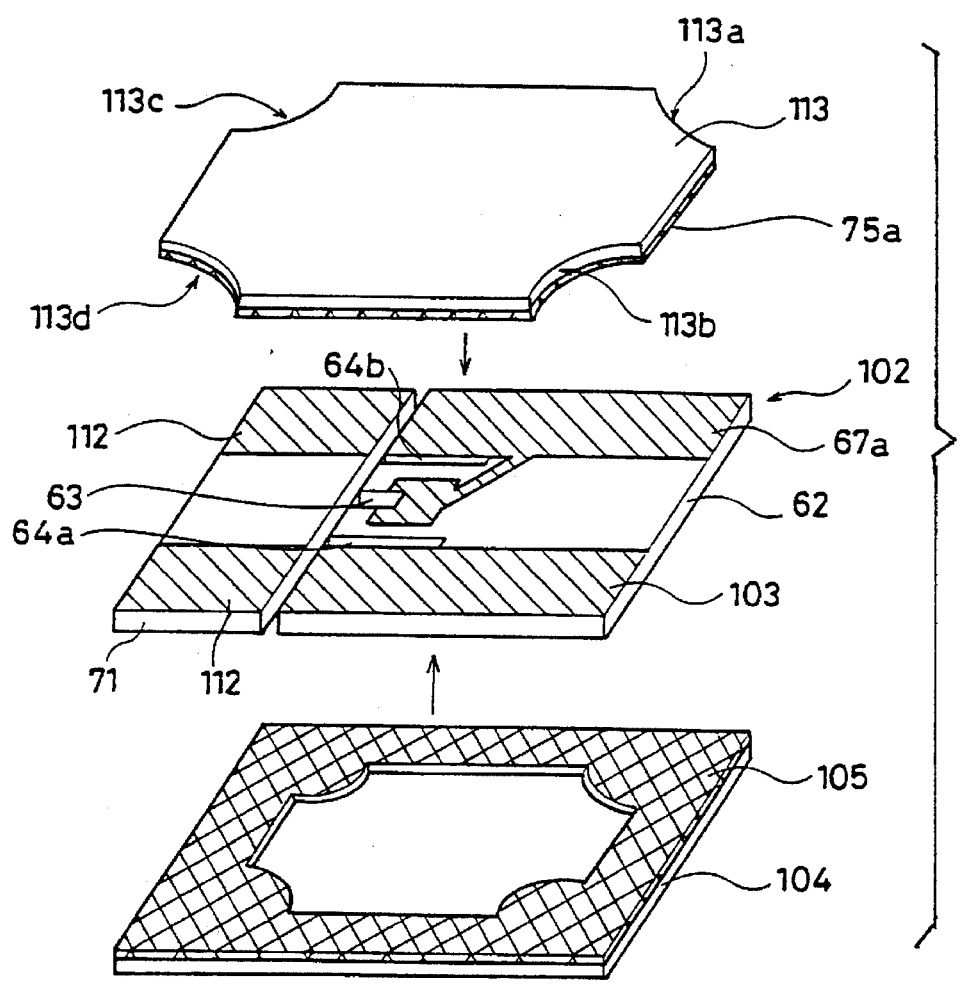

FIGS. 18A and 18B are respectively a perspective view and an exploded perspective view showing a chip type piezoelectric resonator part according to a sixth embodiment of the present invention. A chip type piezoelectric resonator part 111 according to the sixth embodiment uses all the same piezoelectric resonator as the piezoelectric resonator 102 shown in FIG. 12B except for the following. More specifically, electrodes 112 are formed spaced apart form each other by a predetermined distance on the upper surface of a spacer 71, and notches 113a and 113d are provided in four corner portions of an upper protective sheet 113. In the laminated state, connecting electrodes 67a and 103 and the electrodes 112 are exposed by the notches 113a to 113d, as shown in FIG. 16A. Accordingly, when the chip type piezoelectric resonator part 111 is mounted on a printed circuit board or the like, the connecting electrodes 67a and 103 and the electrodes 112 can be joined to the printed circuit board by soldering or the like in four corners of the piezoelectric resonator part 111.

The chip type piezoelectric resonator part shown in FIG. 12A is liable to be disconnected from the printed circuit board or the like when an external force is exerted in the direction represented by an arrow X shown in FIG. 12A. On the other hand, the chip type piezoelectric resonator part 111 according to the present embodiment is firmly joined to the printed circuit board, thereby allowing such an accident to be reliably prevented. Furthermore, in the chip type piezoelectric resonator part shown in FIG. 12A, the notches 73a and 73b for exposing the connecting electrodes 67a and 103 are not formed in corner portions but in the central portions of sides of the protective sheet 73 but the notches 73a and 73b are relatively in close proximity to the tuning fork type vibrating portion. Accordingly, the width of the adhesive 75a must be decreased around the periphery of each of the notches 73a and 73b, so that the airtightness of the tuning fork type vibrating portion may not be obtained. On the other hand, in the structure shown in FIG. 18A, the notches 113a to 113d are arranged in the four corners of the protective sheet 113, that is, the notches 113a to 113d are arranged in portions which are further away from the tuning fork type vibrating portion. Accordingly, the width of an adhesive layer can be made significantly large, so that the airtightness of the tuning fork type vibrating portion can be enhanced.

Figure 17A:
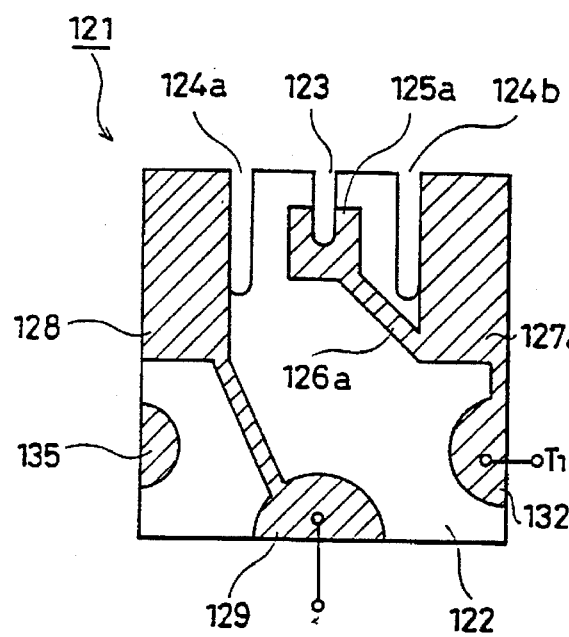
FIGS. 17A and 17B are respectively a plan view and a bottom plan view illustrating a piezoelectric resonator according to a seventh embodiment of the present invention.
Figure 17B:
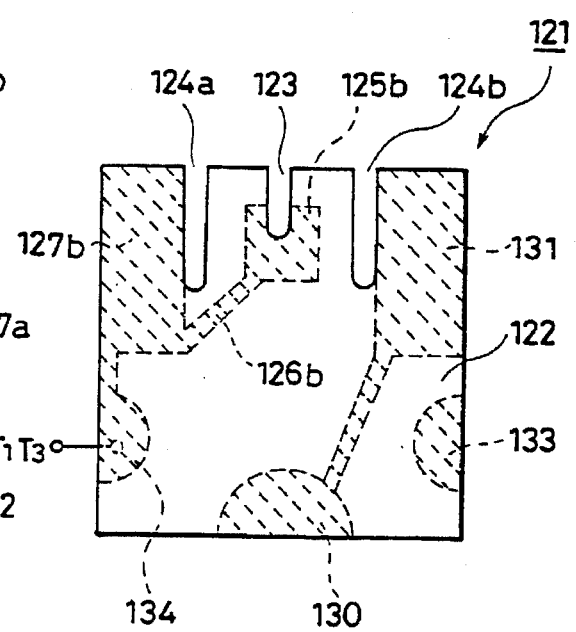

FIGS. 17A and 17B are respectively a plan view showing a piezoelectric resonator according to a seventh embodiment of the present invention and a schematic plan view showing an electrode shape on the side of the lower surface as seen from above through a piezoelectric substrate.

In a piezoelectric resonator 121, a tuning fork portion forming slit 123 is formed so as to extend toward the inside from the center of one edge of a piezoelectric substrate 122 nearly rectangular in shape. A pair of tuning fork portion separating slits 124a and 124b is formed spaced apart from a tuning fork portion forming slit 123 by a predetermined distance on both sides of the tuning fork portion forming slit 123 and approximately parallel with the tuning fork portion forming slit 123. A tuning fork type vibrating portion formed between the tuning fork portion separating slits 124a and 124b is constructed similarly to that in the piezoelectric resonator 61 shown in FIG. 9. More specifically, almost U-shaped first and second electrodes 125a and 125b are formed on both major surfaces of the piezoelectric substrate 122 in the vicinity of an innermost portion of the tuning fork portion forming slit 123. The electrodes 125a and 125b are electrically connected to connecting electrodes 127a and 127b by connecting conductive portions 126a and 126b, respectively.

In the present embodiment, an electrode 128 opposed to the connecting electrode 127b on the lower surface of the piezoelectric substrate 122 through the piezoelectric substrate 122 is formed on the upper surface thereof. This electrode 128 and the connecting electrode 127b constitute a capacitor. The electrode 128 is electrically connected to a terminal 129 formed in a non-vibrating region of the piezoelectric substrate 122. In addition, an electrode 130 is formed on the lower surface of the piezoelectric substrate 122 so as to be opposed to the terminal electrode 129 through the piezoelectric substrate 122. This electrode 130 is connected to the terminal electrode 129 by a conductive portion (not shown) and is electrically connected to an electrode 131 on the lower surface of the piezoelectric substrate 122. The electrode 131 is formed so as to be opposed to the connecting electrode 127a on the upper surface of the piezoelectric substrate 122 through the piezoelectric substrate 122.

Furthermore, a half-round terminal electrode 132 is electrically connected to the connecting electrode 127a, and a half-round electrode 133 is formed in a portion opposed to the terminal electrode 132 through the piezoelectric substrate 122. Similarly, a half-round terminal electrode 134 is formed on the lower surface of the piezoelectric substrate 122 so as to be electrically connected to the connecting electrode 121b, and an electrode 135 is formed in the position opposed to the terminal electrode 134 through the piezoelectric substrate 122.

Figure 18:
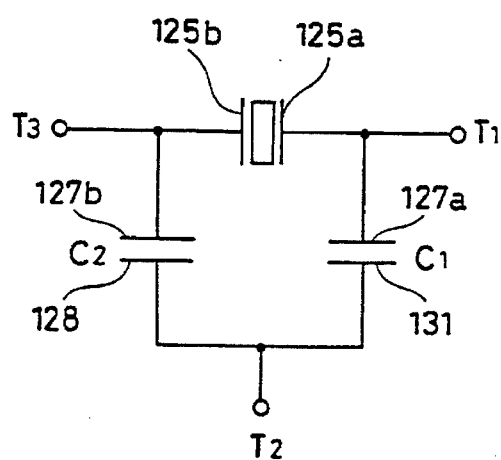
FIG. 18 is a diagram showing a circuit structure of the piezoelectric resonator according to the seventh embodiment.

In the piezoelectric resonator 121 according to the present embodiment, therefore, if the terminal electrode 132 is used as an input or output terminal $T_1$, the terminal electrode 134 is used as an input or output terminal $T_3$ and the terminal electrode 129 is used as an earth terminal $T_2$, a circuit structure shown in FIG. 18 is realized. More specifically, in the piezoelectric resonator 121 according to the present embodiment, a Colpitts circuit is constructed in which two capacitors $C_1$ and $C_2$ are connected to a tuning fork type piezoelectric resonator unit. Accordingly, an external capacitor can be omitted so as to construct a Colpitts oscillator. Accordingly, the oscillator circuit can be miniaturized.

Furthermore, in the piezoelectric resonator 121 according to the present embodiment, the capacitors $C_1$ and $C_2$ are contained in the piezoelectric substrate 122, so that there occurs no problem of unconformity between temperature characteristics of the piezoelectric resonator unit and the capacitors. Accordingly, temperature characteristics of the oscillator circuit can be improved.

Meanwhile, the electrodes 133 and 135 can be used as terminal electrodes for connection to the exterior in place of the terminal electrodes 132 and 134. More specifically, the electrode 133 is coupled to the terminal electrode 132 through the piezoelectric substrate 122 by capacitance. Accordingly, the electrode 133 can be used as a terminal electrode in place of the terminal electrode 132. Similarly, the electrode 135 can be also used as a terminal electrode in place of the terminal electrode 134. The electrodes 133 and 135 are thus suitably used, thereby allowing the piezoelectric resonator 121 to be electrically connected to the exterior on an arbitrary side of the upper surface and the lower surface of the piezoelectric substrate 122 by suitably using the electrodes 133 and 135.

Figure 19A:
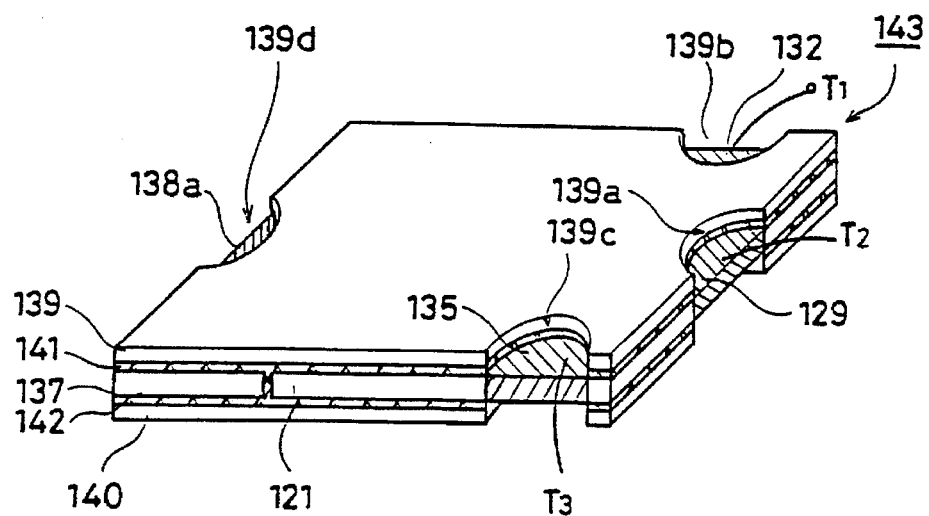
FIGS. 19A and 19B are respectively a perspective view and an exploded perspective view showing an example in which the piezoelectric resonator according to the seventh embodiment is constructed as a chip type part.
Figure 19B:
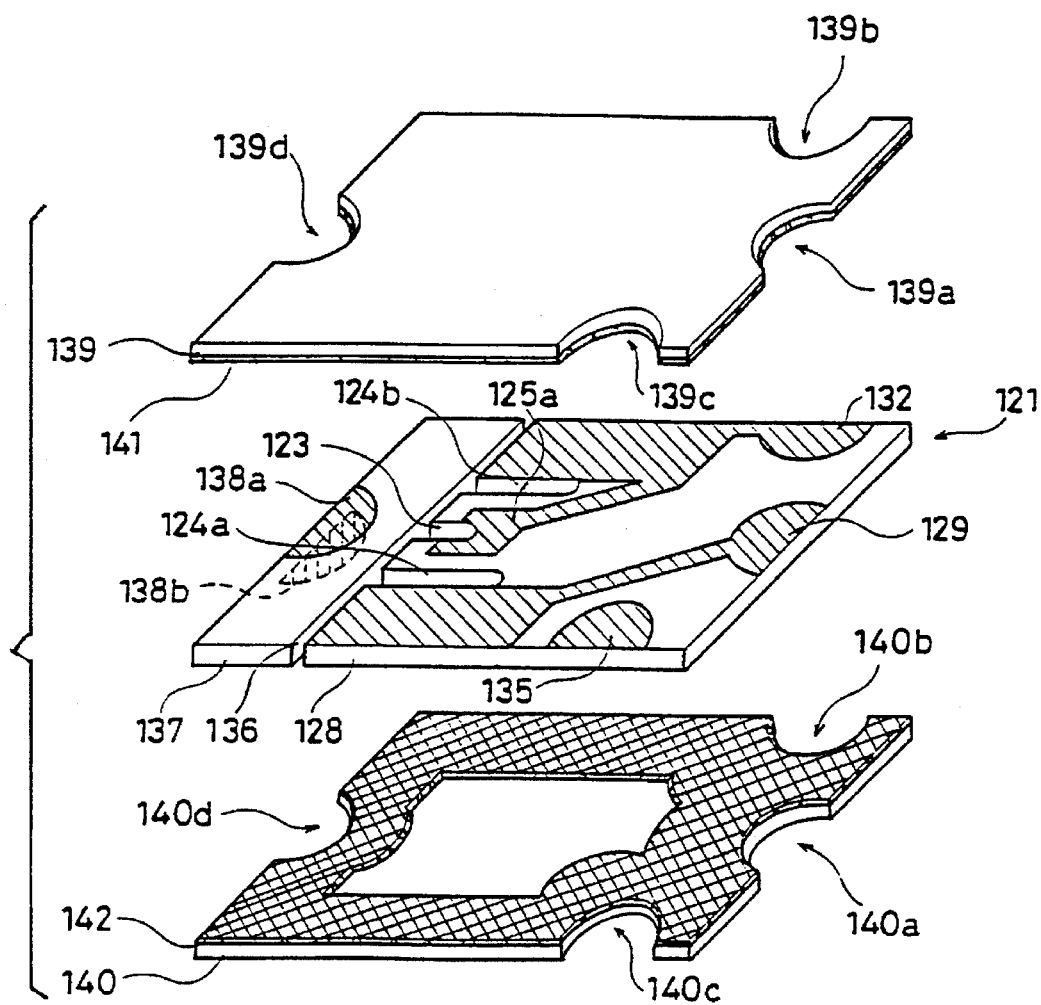

FIGS. 19A and 19B are perspective views showing an example in which the above described piezoelectric resonator 121 suitable for forming the oscillator circuit is constructed as a chip type part. A spacer 137 is arranged spaced apart form a tuning fork type vibrating portion of the piezoelectric resonator 121 through a cavity 136. A half-round electrode 138a is formed on the upper surface of the spacer 137, and an electrode 138b is formed so as to be opposed to the electrode 138a through the specer 137 on the lower surface thereof. Protective sheets 139 and 140 are respectively provided with notches 139a, 139b, 139c, 139d and notches 140a, 140b, 140c, 140d corresponding to electrodes formed on both major surfaces of the piezoelectric resonator 121 and the spacer 137. Reference numerals 141 and 142 designate adhesives.

The protective sheets 139 and 140 are affixed to the piezoelectric resonator 121 and the spacer 137 with the adhesives 141 and 142, thereby to obtain a chip type piezoelectric resonator device shown in FIG. 19A.

Meanwhile, the notches 139d and 140d are provided so as to expose the electrodes 138a and 138b. The piezoelectric resonator part 143 can be firmly joined and fixed to a circuit board by joining the electrodes 138a or 138b to the circuit board by soldering.

Figure 20:
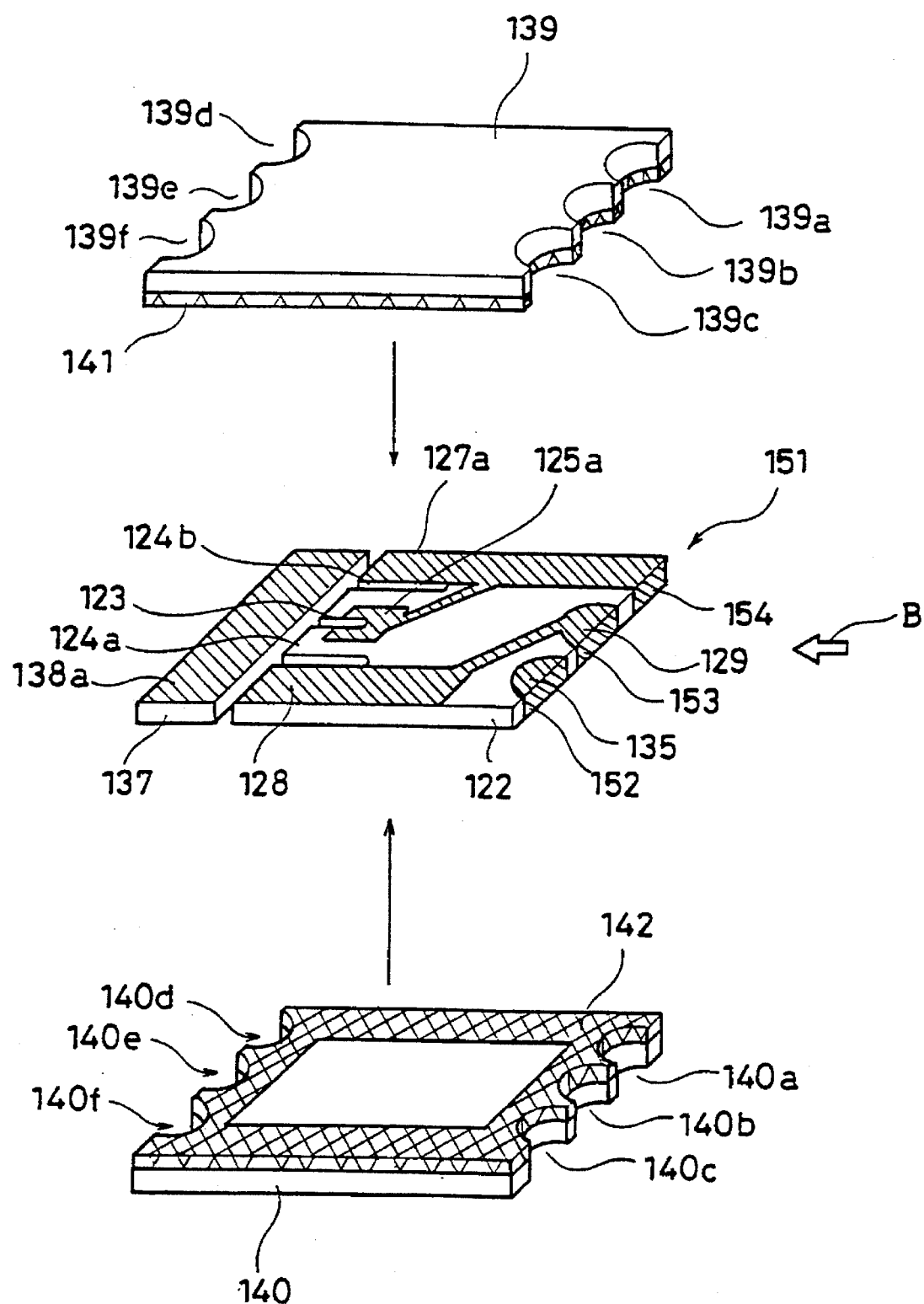
FIG. 20 is an exploded perspective view illustrating a chip type piezoelectric resonator according to an eighth embodiment of the present invention.

FIG. 20 is an exploded perspective view illustrating a chip type piezoelectric resonator part according to an eighth embodiment of the present invention. The chip type piezoelectric resonator device according to the present embodiment corresponds to a modified one of the chip type piezoelectric resonator part shown in FIGS. 19A and 19B. In the following, portions corresponding to those in the structure shown in FIGS. 17A to 19B have the same reference numerals and hence, the description thereof is not repeated.

A piezoelectric resonator 151 according to the present embodiment is the same as the piezoelectric resonator 121 shown in FIGS. 17A and 17B except that connecting electrodes and terminal electrodes for connecting electrodes formed on the upper and lower surfaces of a piezoelectric substrate 122 to an external circuit are all arranged on the side of an edge 122a on the opposite side of a side along which a tuning fork type vibrating portion is formed. More specifically, an electrode 135 is arranged spaced apart from a terminal electrode 129 by a predetermined distance along the same side as that along which the terminal electrode 129 is formed. Accordingly, notches 139a, 139b, 139c and 140a, 140b 140c provided for protective sheets 139 and 140 affixed to the piezoelectric resonator 151 from above and below are all formed on the same sides of the protective sheets 139 and 140.

In the structure shown in FIG. 20, therefore, when end electrodes 152, 153, 154 can be simply formed by sputtering from the direction represented by an arrow B in FIG. 20 so as to electrically connect electrodes in the positions opposed to each other on the sides of the upper and lower surfaces of the piezoelectric substrate 122.

A whole surface electrode 138a is formed on the upper surface of a spacer 137. Similarly, a whole surface electrode 138a is also formed on the lower surface thereof. The whole surface electrodes 138a are exposed to notches 139d, 139e, 139f and 140d, 140e, 140f respectively provided for the protective sheets 139 and 140. The notches 139e and 139f and 140e and 140f are not necessarily indispensable, though a side of the protective sheets along which the notches 139a, 139b, 139c and 140a, 140b, 140c are respectively provided and a side of the protective sheets along which the notches 139d, 139e 139f and 140d, 140e 140f are respectively provided can be made identical in shape by forming the notches 139e and 139f and 140e and 140f.

Meanwhile, in the notch portions 139d, 139e, 139f and 140d, 140e, 140f which expose the electrodes formed on the upper and lower surfaces of the spacer 137, end electrodes may be provided by sputtering as required.

The notches 139d, 139e, 139f and 140d, 140e, 140f are provided on the side of the spacer 137. Accordingly, the chip type piezoelectric resonator part according to the present embodiment can be firmly joined and fixed to a printed circuit board in mounting the same on the printed circuit board.

Although in the above described embodiments, the plane shape of each of the notches provided in constructing the chip type piezoelectric resonator part is illustrated as a half-round shape, the shape of each of the notches may be another shape, for example, a square shape.

The piezoelectric resonator device according to the present invention can be applied to not only the above described piezoelectric resonator but also a piezoelectric filter. Description is now made of embodiments in which the piezoelectric resonator device is applied to the piezoelectric filter.

FIGS. 21A and 21B are respectively a plan view and a bottom plan view illustrating a piezoelectric filter according to a ninth embodiment of the present invention. In a piezoelectric filter 201, there is provided a tuning fork portion forming slit 203 extending toward the center from one edge of a piezoelectric substrate 202. In addition, tuning fork portion separating slits 204a and 204b are formed approximately parallel with the tuning fork portion forming slit 203 on both sides of the tuning fork portion forming slit 203. Arm portions 205a and 205b are formed on both sides of the tuning fork portion forming slit 203 by the three slits 203, 204a and 204b. The arm portions 205a and 205b constitute a tuning fork portion, which becomes a piezoelectric vibrating portion of the piezoelectric filter 201.

On the upper surface of the piezoelectric substrate 202A, a first electrode 206 and a second electrode 207 are formed spaced apart from each other with predetermined spacing in the vicinity of the periphery of the tuning fork portion forming slit 203.

Figure 27A:
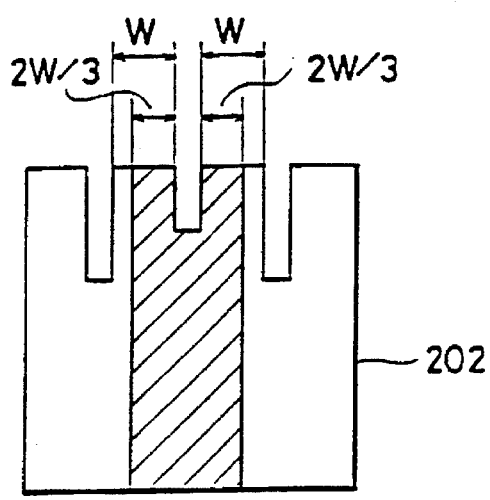
FIGS. 27A and 27B are respectively a plan view and a bottom plan view for explaining the sizes of electrodes formed in the piezoelectric filter.

A region represented by hatching in FIG. 27A indicates a region where the first electrode 206 and the second electrode 207 shown in FIG. 21A can be formed. The first and second electrodes 206 and 207 can be formed in arbitrary portions within this region.

Figure 27B:
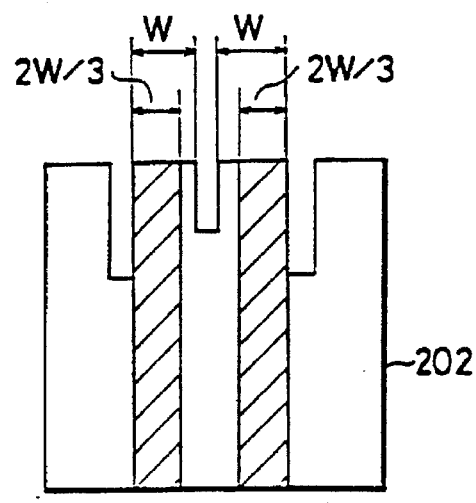

FIG. 27A is a drawing indicating the region where the electrodes 206 and 207 in FIG. 21A are to be formed. Also, FIG. 27B is a drawing indicating the region where the electrodes 205a and 205b are to be formed. These electrodes 206 and 207 and 205a and 205b can be within the regions shown by hatching, respectively.

On the other surface of the piezoelectric substrate 202A, a third electrode 208 is formed so as to be opposed to the first and second electrodes 206 and 207 (see FIG. 21B).

The third electrode 208 may have an arbitrary shape provided that it is formed so as to be opposed to the first and second electrodes 206 and 207.

FIG. 22A shows a modified example of the shapes of electrodes formed on the upper surface of the piezoelectric substrate 202 shown in FIG. 21A. In addition, FIGS. 22B and 22C are bottom plan views respectively showing modified examples of the shapes of electrodes formed on the lower surface of the piezoelectric substrate 202. In FIGS. 22A to 22C, the same reference numerals are assigned to the same components as those shown in FIGS. 21A and 21B and hence, the description thereof is not repeated.

In FIG. 22C, however, a third electrode is adapted so as to comprise divided two third electrodes 208a and 208b.

Although in the above described piezoelectric filter 201, the first electrode 206 and the second electrode 207 are formed in the vicinity of the periphery of the tuning fork portion forming slit 203, the first and second electrodes 206 and 207 may be formed in portions along outer edges of the arm portions 205a and 205b.

Figure 23A:
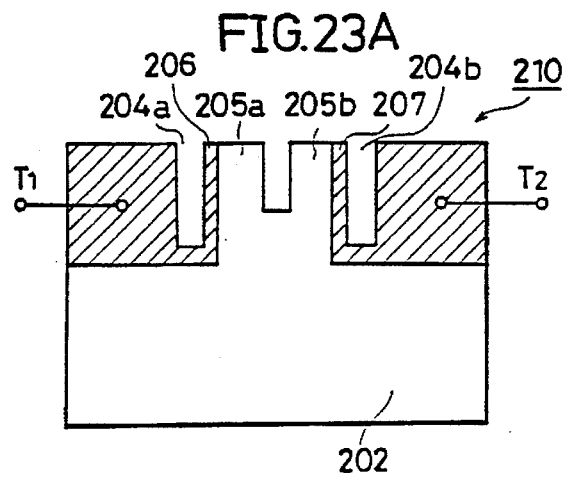
FIGS. 23A and 23B are respectively a plan view and a bottom plan view illustrating a piezoelectric filter according to a tenth embodiment of the present invention.

FIGS. 23A to 23D illustrate a piezoelectric filter according to a tenth embodiment of the present invention. In the tenth embodiment, first and second electrodes 206 and 207 are formed along outer edges of arm portions 205a and 205b. FIG. 23A illustrates the side of the upper surface of a piezoelectric filter 210. The first electrode 206 and the second electrode 207 are respectively formed in portions along the outer edges of the arm portions 205a and 205b. In the structure shown in FIG. 23A, the first electrode 206 and the second electrode 207 can be formed within regions represented by hatching in FIG. 27B. Each of the regions represented by hatching has a width which is two-thirds of a width W of each of the arm portions 205a and 205b.

Figure 23B:
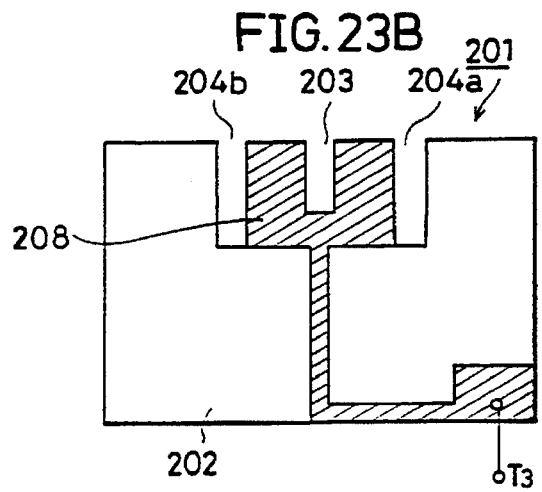
Figure 23C:
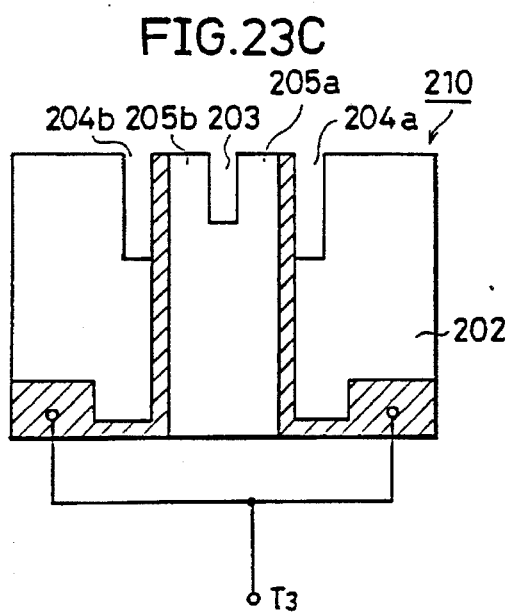
FIGS. 23C and 23D are bottom plan views respectively showing modified examples of an electrode pattern on the side of the lower surface of the piezoelectric filter according to the tenth embodiment.
Figure 23D:
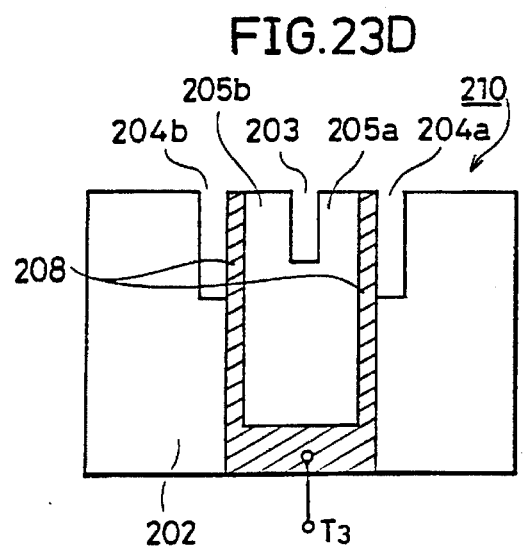

As shown in FIGS. 23B, 23C, 23D, a third electrode 208 formed on the lower surface of a piezoelectric substrate 202 is produced in a variety of shapes as in the modified examples shown in FIGS. 22B and 22C.

Figure 24A:
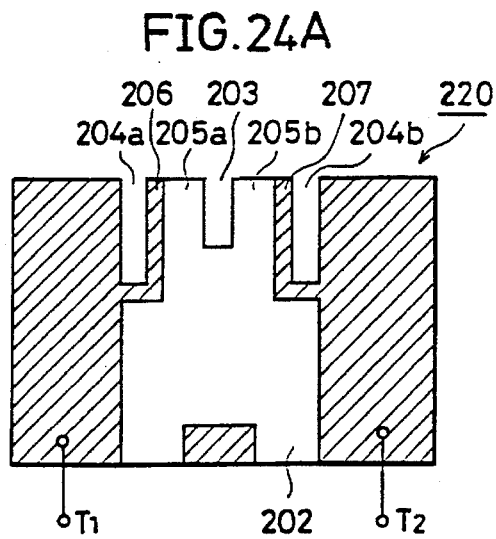
FIGS. 24A and 24B are respectively a plan view and a bottom plan view illustrating a piezoelectric filter according to an eleventh embodiment of the present invention.
Figure 24B:
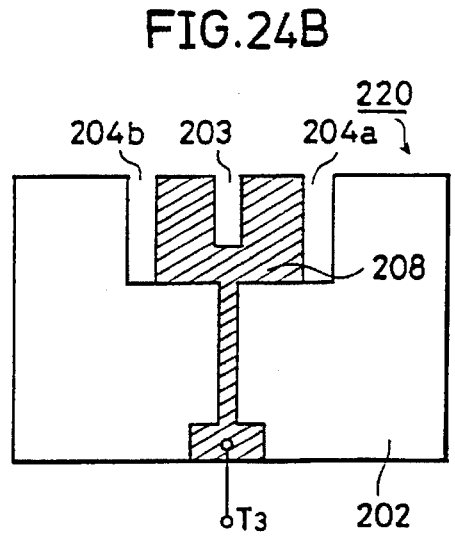

FIGS. 24A and 24B are respectively a plan view and a bottom plan view illustrating a piezoelectric filter according to an eleventh embodiment of the present invention. A piezoelectric filter 220 according to the present embodiment corresponds to a modified one of the piezoelectric filter 220 shown in FIGS. 23A and 23B. The piezoelectric filter 220 is the same as the piezoelectric filter 210 except that the shapes of electrode extending portions of first to third electrodes 206 to 208 formed on the upper and lower surfaces of a piezoelectric substrate 202, that is, electrode portions for connection to the exterior are changed.

In each of the above described piezoelectric filters 201, 210 and 220, the first, second, and third electrodes are respectively connected to a first leading terminal $T_1$, a second leading terminal $T_2$ and a third leading terminal $T_3$ through the electrode extending portions formed in a non-vibrating region other than a tuning fork type vibrating portion on the piezoelectric substrate 202.

Therefore, piezoelectric vibration of the tuning fork type vibrating portion is not prevented by a connecting structure of the leading terminals $T_1$, $T_2$ and $T_3$ to the exterior.

Figure 26:
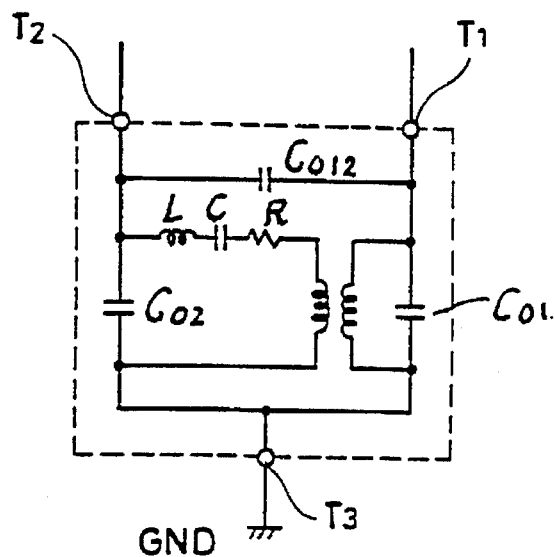
FIG. 26 is a diagram showing an equivalent circuit of the piezoelectric filter according to the tenth embodiment.

FIG. 26 shows an equivalent circuit of the above described piezoelectric filters 201, 210 and 220.

A piezoelectric ceramic filter utilizes a function of converting a mechanical resonance to an electrical resonance. Therefore, in the frequency region near the resonance point, the piezoelectric filter can be expressed as an electrical resonance circuit including capacitances between electrodes as shown in FIG. 26, which is an equivalent circuit well known to those skilled in the art. In FIG. 26, $C_{01}$ is the capacitance between terminals $T_1$ and $T_3$, $C_{02}$ is the capacitance between terminals $T_2$ and $T_3$, and $C_{012}$ is the capacitance between terminals $T_1$ and $T_2$. $T_1$ indicates the output terminal, $T_2$ indicates the input terminal and $T_3$ indicates the grounded terminal. L, C and R, which are serial-connected, constitute an equivalent circuit that expresses the conversion of a mechanical resonance to an electrical resonance. C corresponds to elasticity and is referred to as equivalent compliance. L corresponds to inertial force of mass or moment and is referred to as equivalent inductance. R represents mechanical frictional resistance and is referred to as equivalent resistance.

The piezoelectric filters 201, 210 and 220 according to the above described embodiments can be fixed to other members in the non-vibrating region other than the tuning fork type piezoelectric vibrating portion. Accordingly, sheathing of the piezoelectric filters 201, 210 and 220 is simplified as described below, as compared with that of a piezoelectric filter utilizing a square plate type extending vibration mode conventionally used. In addition, the shapes themselves of first, second, and third electrodes are simplified, which shows that it is easy to change the shapes of the electrodes and the electrode extending portions for connection to the exterior. Accordingly, it is also easy to connect the electrodes to the leading terminals $T_1$ to $T_3$. In particular, the leading shape of the second electrode is simplified.

Figure 25A:
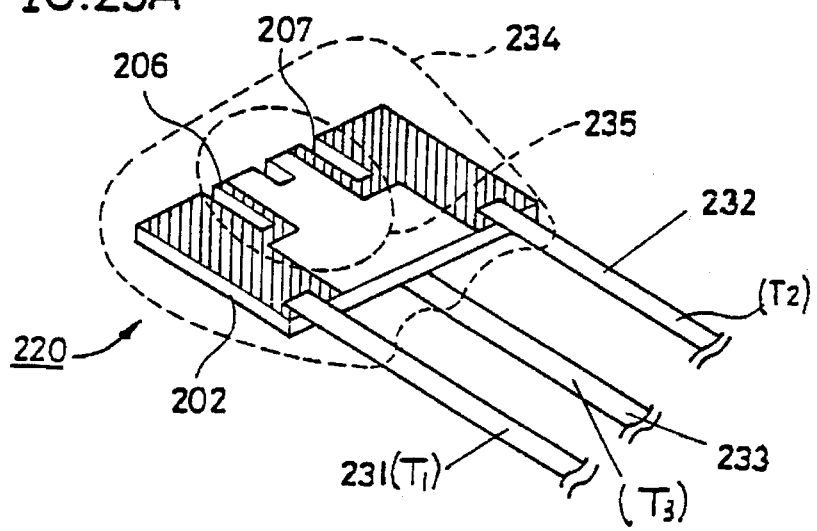
FIG. 25A is a perspective view for explaining a structure formed as a piezoelectric filter with lead terminals.

FIG. 25A is a perspective view schematically showing a structure in which a piezoelectric filter 220 is sheathed in resin. Lead terminals 231, 232, and 233 are respectively connected to a first electrode 206, a second electrode 207 and a third electrode on the lower face of the filter 220 as the above described leading terminals $T_1$ to $T_3$. A tuning fork type piezoelectric vibrating portion is coated with wax (not shown) or the like and then, the whole other than innermost portions of the lead terminals 231 to 233 is dipped in resin and this resin is further baked.

The wax is absorbed into a resin sheath 234 (reference numeral represented by a broken line in FIG. 25A) by baking of the resin. Accordingly, a cavity portion 235 (represented by a broken line) is formed in a peripheral portion of the tuning fork type piezoelectric vibrating portion.

Accordingly, parts of the piezoelectric filter 220 can be sheathed without using a spring or the like, unlike the piezoelectric filter utilizing the square plate type extending vibration mode conventionally often used. Consequently, the piezoelectric filter can be decreased in cost and miniaturized.

FIG. 28A shows spurious response characteristics of the piezoelectric filter sheathed in resin as shown in FIG. 25A. For comparison, FIG. 28B shows spurious response characteristics of the piezoelectric filter utilizing the square plate type extending vibration mode conventionally commonly used. A comparison of the characteristics shown in FIGS. 28A and 28B shows that spurious response, relative to a desired frequency, can be effectively reduced ($A_1$ in FIG. 28A<$A_2$ in FIG. 28B).

It is considered that such a spurious-response-reducing effect is produced due to the fact that a factor preventing piezoelectric vibration is removed because a spring or the like is not used.

Figure 25B:
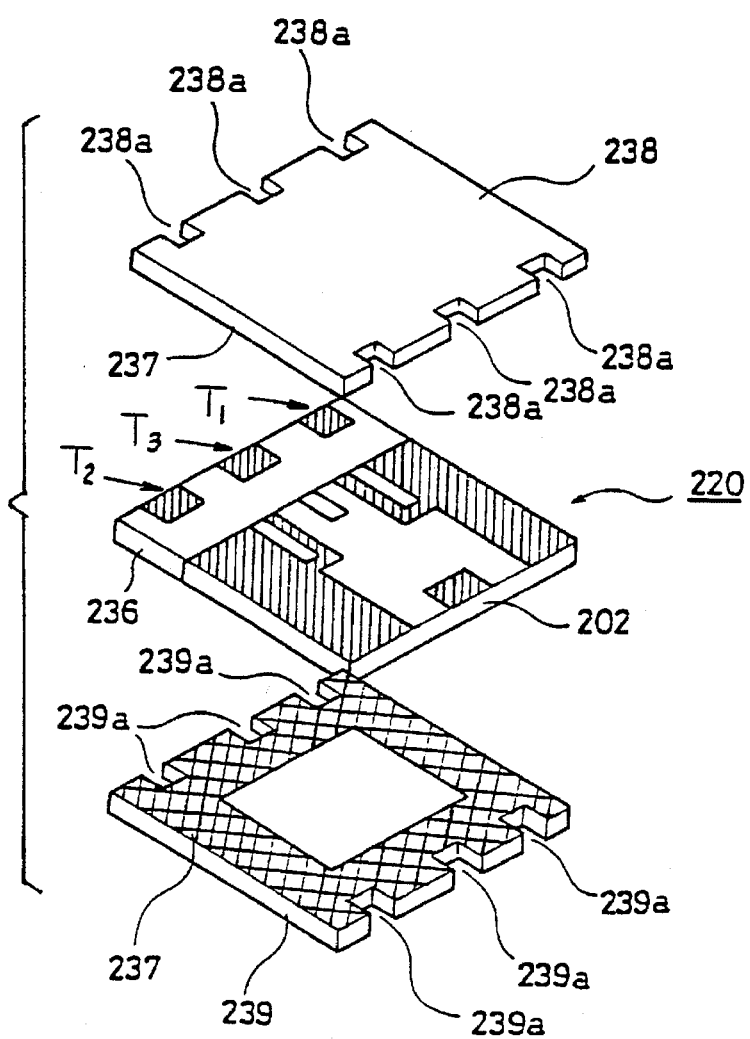
FIG. 25B is an exploded perspective view for explaining a structure formed as a chip type piezoelectric filter.

FIG. 25B is an exploded perspective view for explaining another method of sheathing the piezoelectric filter. In FIG. 25B, a spacer 236 is arranged in a side portion of a piezoelectric substrate 202 so as not to prevent piezoelectric vibration of a tuning fork type vibrating portion of the piezoelectric substrate 202. The piezoelectric substrate 202 and the spacer 236 are affixed to protective sheets 238 and 239 coated with adhesives 237 with they being sandwiched between protective sheets 238 and 239.

In the structure shown in FIG. 25B, leading terminals $T_1$ to $T_3$ are exposed to the exterior by notches 238a and 239a provided for the protective sheets 238 and 239 as required.

Figure 29A:
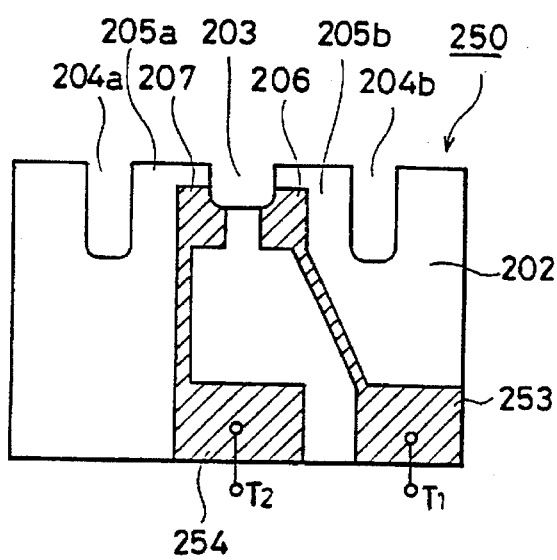
FIGS. 29A and 29B are respectively a plan view and a bottom plan view illustrating a piezoelectric filter according to a twelfth embodiment of the present invention.
Figure 29B:
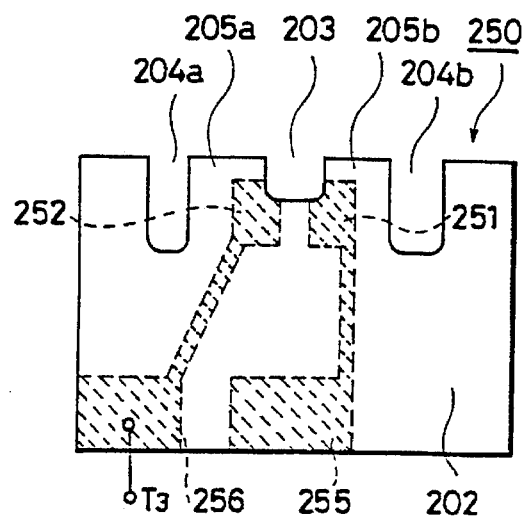

FIGS. 29A and 29B are plan views respectively showing a piezoelectric filter according to a twelfth embodiment of the present invention and showing electrodes on the lower surface as seen from above through a piezoelectric substrate. In a piezoelectric filter 250, first and second electrodes 206 and 207 are formed on the upper surface of a piezoelectric substrate 202, as in the above described piezoelectric filters 201 and 220. On the lower surface of the piezoelectric substrate 202, however, third and fourth electrodes 251 and 252 are respectively formed so as to be opposed to the first and second electrodes 206 and 207 through the piezoelectric substrate 202, as shown in FIG. 29B.

The first electrode 206 is connected to a first leading terminal $T_1$ by an electrode extending portion 253 formed in a non-vibrating region of the piezoelectric substrate 202.

The third electrode 251 formed on the lower surface of the piezoelectric substrate 202 is opposed to the first electrode 206 and is electrically connected to the second electrode 207. This electrical connection between the second and third electrodes 207 and 251 is made by connecting both an electrode extending portion 254 of the second electrode 207 formed on the non-vibrating region of the piezoelectric substrate 202 and an electrode extending portion 255 of the third electrode 251 to a leading terminal $T_2$.

Instead of the above described electrical connection by the leading terminal $T_2$, a conductive film may be applied to the side surface of the piezoelectric substrate 202a by sputtering or the like, thereby to electrically connect the extending portion 254 of the second electrode 207 to the extending portion 255 of the third electrode 251.

The above described electrical connection between the second electrode 207 and the third electrode 251 constitutes differential connection.

The fourth electrode 252 is opposed to the second electrode 207 through the piezoelectric substrate 202 and is connected to a third leading terminal $T_3$ by an electrode extending portion 256 formed in the non-vibrating region of the piezoelectric substrate 202.

Figure 30A:
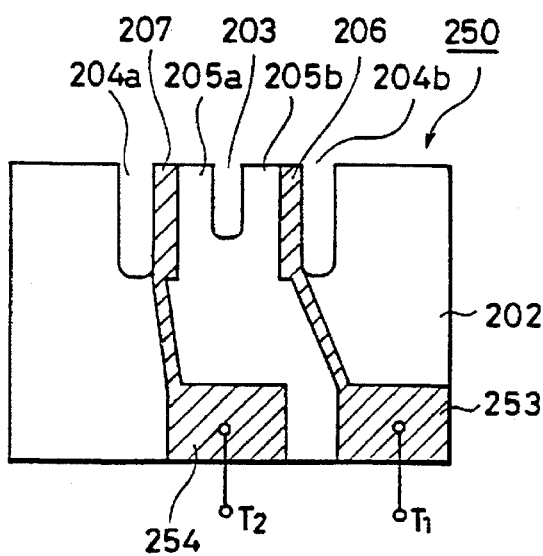
FIGS. 30A and 30B are respectively a plan view and a bottom plan view showing a modified example of the piezoelectric filter according to the twelfth embodiment.
Figure 30B:
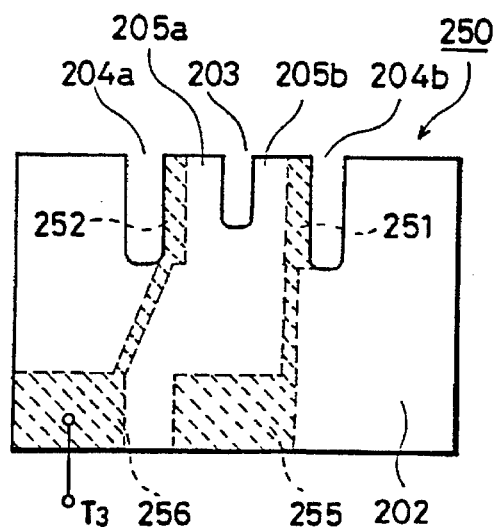

FIGS. 30A and 30B show a modified example of the piezoelectric filter 250 according to the above described twelfth embodiment. This modified example is the same as the piezoelectric filter 250 according to the twelfth embodiment except that first to fourth electrodes 206, 207, 251 and 252 are formed along outer edges of arm portions 205a and 205b.

Figure 31A:
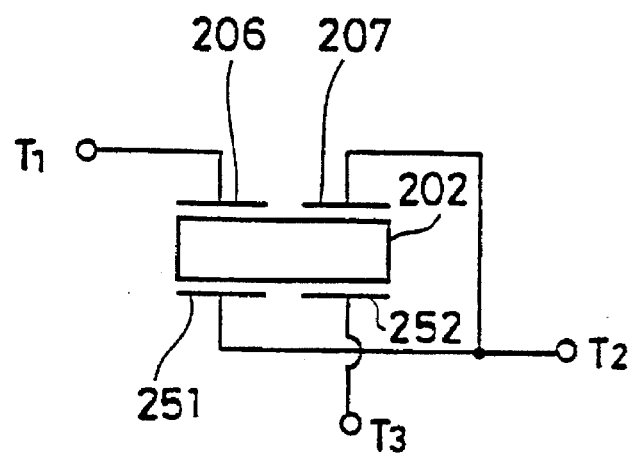
FIG. 31A is a diagram symbolically showing a circuit structure of the piezoelectric filter according to the twelfth embodiment.
Figure 31B:
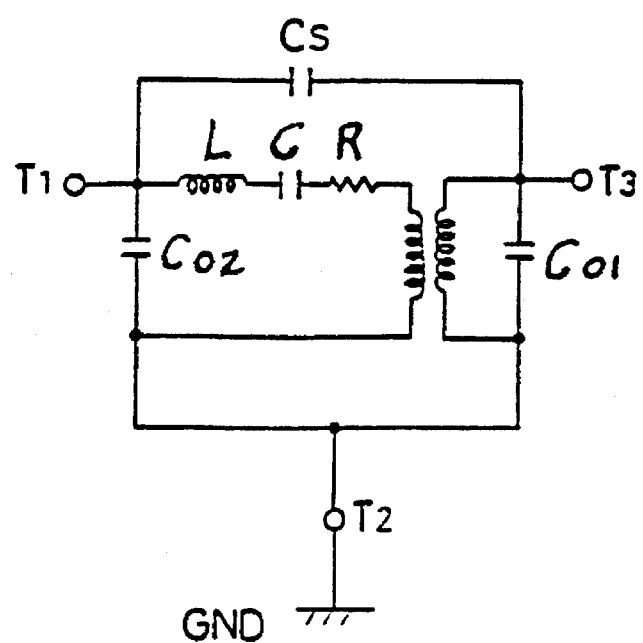
FIG. 31B is a diagram showing an equivalent circuit of the piezoelectric filter according to the twelfth embodiment.

FIG. 31A symbolically shows the connecting state between the first to fourth electrodes 206, 207, 251 and 252 of the piezoelectric filter 250 according to the twelfth embodiment. In addition, FIG. 31B shows an equivalent circuit of this piezoelectric filter 250. The equivalent circuit of the piezoelectric filter 250 in FIG. 31B is generally analogous to that in FIG. 26 which is described above.

The piezoelectric filter 250 according to the twelfth embodiment can be simply sheathed by using a resin sheath or a protective sheet, similarly to the above described piezoelectric filters 201 and 220. In addition, first to fourth electrodes for forming a vibrating portion are formed to have simple shapes. Accordingly, it is found that the shapes of the first to fourth electrodes and electrode extending portions for connection to the exterior can be easily changed.

Furthermore, in the piezoelectric filter 250 according to the twelfth embodiment, the second electrode 207 and the third electrode 251 are differentially connected to each other, and the first electrode 206 and the fourth electrode 252 are formed in the positions which are not opposed to each other through a piezoelectric substrate 202 as can be seen from the positional relation between the first to fourth electrodes shown in FIG. 31A. Accordingly, stray capacitance $C_S$ (see FIG. 31B) between the first electrode 206 and the fourth electrode 252 is made smaller.

FIG. 32A shows spurious characteristics of the piezoelectric filter 250 according to the twelfth embodiment. For comparison, FIGS. 32B shows spurious characteristics of the piezoelectric filter utilizing the square plate type extending vibration mode conventionally used. A comparison of the characteristics shown in FIGS. 32A and 32B shows that unnecessary spurious response can be effectively restrained in the piezoelectric filter 250 according to the present embodiment ($A_1$ in FIG. 32A<$A_2$ in FIG. 32B).

Figure 33A:
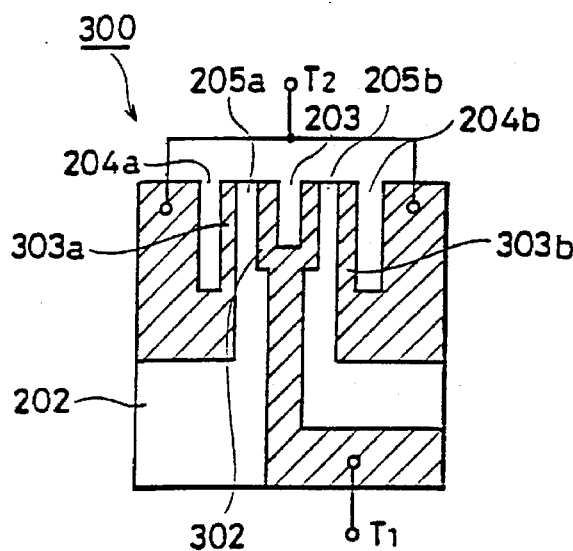
FIGS. 33A and 33B are respectively a plan view and a bottom plan view illustrating a piezoelectric filter according to a thirteenth embodiment of the present invention.
Figure 33B:
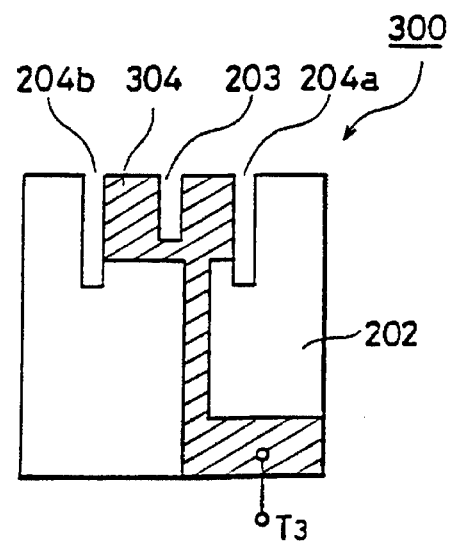

FIGS. 33A and 33B are respectively a plan view and a bottom plan view illustrating a piezoelectric filter 300 according to a thirteenth embodiment of the present invention. A first electrode 302 is formed along side edges of a tuning fork portion forming slit 203 provided for a piezoelectric substrate 202. Second electrodes 303a and 303b are formed spaced apart form the first electrode 302 by a predetermined distance along outer edges of arm portions 205a and 205b.

On the other hand, on the lower surface of a piezoelectric substrate 202, a third electrode 304 is formed so as to be opposed to the first electrode 302 and the second electrodes 303a and 303b.

The above described first, second, and third electrodes 302, 303, 304 are electrically connected to electrode extending portions formed in a non-vibrating region other than a tuning fork type vibrating portion of the piezoelectric substrate 202, which are electrically connected to first to third leading terminals $T_1$ to $T_3$, respectively.

Figure 34A:
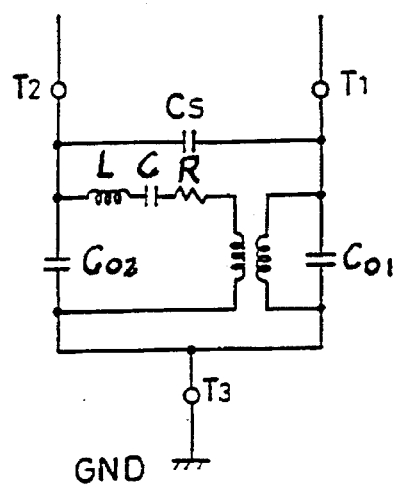
FIG. 34A is a diagram showing an equivalent circuit of the piezoelectric filter according to the thirteenth embodiment.
Figure 34B:
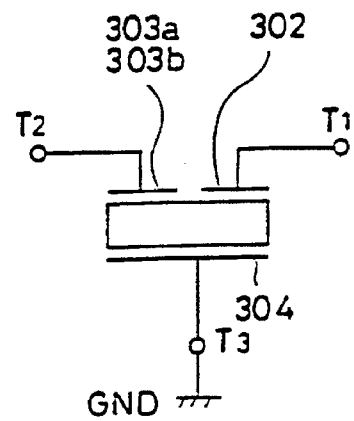
FIG. 34B is a diagram symbolically illustrating the piezoelectric filter.

FIG. 34A shows an equivalent circuit of the piezoelectric filter 300, which is generally analogous to the equivalent circuit of FIG. 26 which is described above. FIG. 34B shows the positional relation of the electrodes.

The piezoelectric filter 300 according to the thirteenth embodiment need not be held by a spring or the like. Accordingly, a part with lead terminals or a chip type part can be simply constructed by the above described resin sheathing process or a sheathing process using a protective sheet. Consequently, the piezoelectric filter utilizing the square plate type extending vibration mode conventionally often used must be held by a spring or the like, while a holding method using a member for restraining such mechanical vibration can be avoided in the present embodiment, so that spurious characteristics can be improved.

However, in the piezoelectric filter 300, the shapes of the first to third electrodes become slightly complicated, as compared with those in the piezoelectric filters 201, 220, 250 and the like according to the above described embodiments.

Furthermore, the distance between the first electrode 302 and each of the second electrodes 302a and 303b is short, so that stray capacitance $C_S$ in FIG. 34A is liable to attain a relatively large value. Consequently, a piezoelectric filter inferior in characteristics to the piezoelectric filter 250 (FIGS. 29A and 29B) shown in FIG. 12 can be actually constructed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A piezoelectric filter with a tuning-fork-type vibrating portion, comprising:

a piezoelectric substrate having a nearly rectangular plane shape having edges and opposed major surfaces, said piezoelectric substrate comprising a first slit defining inner edges of a pair of arm portions of a tuning fork portion, extending inward from one edge of said piezoelectric substrate, and a pair of second slits defining outer edges of said arm portions of said tuning fork portion extending inwardly from said one edge and provided approximately parallel with the first slit, said second slits being respectively on two opposite sides of the first slit, and wherein:

a first vibrating electrode and a second vibrating electrode are disposed on respective sides of the first slit with the first slit being interposed therebetween, localized at an innermost portion of the first slit on one of said opposed major surfaces of the piezoelectric substrate and spaced away from both said one edge of said substrate and said outer edges of said arm portions, and a third vibrating electrode opposed to said first and second electrodes through the piezoelectric substrate disposed on the other of said opposed major surfaces of said piezoelectric substrate.

2. A piezoelectric filter with a tuning-fork-type vibrating portion, comprising:

a piezoelectric substrate having a nearly rectangular plane shape having edges and opposed major surfaces, said piezoelectric substrate comprising a first slit defining inner edges of a pair of arm portions of a tuning fork portion, extending inward from one edge of said piezoelectric substrate, and a pair of second slits defining outer edges of said arm portions of said tuning fork portion extending inwardly from said one edge and provided approximately parallel with the first slit, said second slits being respectively on two opposite sides of the first slit, and wherein:

a first vibrating electrode and a second vibrating electrode are disposed on respective sides of the first slit with the first slit being interposed therebetween, localized at an innermost portion of the first slit on one of said opposed major surfaces of said piezoelectric substrate and spaced away from both said one edge of said substrate and said outer edges of said arm portions, a third vibrating electrode opposed to said first electrode through the piezoelectric substrate disposed on the other of said opposed major surfaces of said piezoelectric substrate and electrically connected to said second electrode, and a fourth electrode opposed to said second electrode through the piezoelectric substrate disposed on the other of said opposed major surfaces of said piezoelectric substrate.

3. A piezoelectric filter with a tuning-fork-type vibrating portion, comprising:

a piezoelectric substrate having a nearly rectangular plane shape having edges and opposed major surfaces, said piezoelectric substrate comprising a first slit defining inner edges of a pair of arm portions of a tuning fork portion, extending inward from one edge of said piezoelectric substrate, and a pair of second slits defining outer edges of said arm portions of said tuning fork portion extending inwardly from said one edge and provided approximately parallel with the first slit, said second slits being respectively on two opposite sides of the first slit, and wherein:

a first vibrating electrode and a second vibrating electrode are disposed on respective sides of the first slit with the first slit being interposed therebetween, localized at an innermost portion of the first slit on one of said opposed major surfaces of the piezoelectric substrate and spaced away from both said one edge of said substrate and said outer edges of said arm portions, and at least one back electrode opposed to said first and second electrodes through the piezoelectric substrate disposed on the other of said opposed major surfaces of said piezoelectric substrate.

* * * * *